(12) United States Patent
Murashige et al.

(10) Patent No.: US 10,520,656 B2
(45) Date of Patent: Dec. 31, 2019

(54) CIRCULAR POLARIZATION PLATE FOR ORGANIC EL DISPLAY DEVICE AND ORGANIC EL DISPLAY DEVICE

(71) Applicant: NITTO DENKO CORPORATION, Ibaraki-shi, Osaka (JP)

(72) Inventors: Takeshi Murashige, Ibaraki (JP); Youichirou Sugino, Ibaraki (JP); Takami Hikita, Ibaraki (JP); Hiroyuki Takemoto, Ibaraki (JP); Mariko Hirai, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/527,063

(22) PCT Filed: Nov. 18, 2015

(86) PCT No.: PCT/JP2015/082368
§ 371 (c)(1),
(2) Date: May 16, 2017

(87) PCT Pub. No.: WO2016/080431
PCT Pub. Date: May 26, 2016

(65) Prior Publication Data
US 2018/0284332 A1    Oct. 4, 2018

(30) Foreign Application Priority Data

Nov. 20, 2014 (JP) ................. 2014-235814
Nov. 17, 2015 (JP) ................. 2015-225007

(51) Int. Cl.
*G02B 5/30* (2006.01)
*G02B 27/28* (2006.01)
(Continued)

(52) U.S. Cl.
CPC ............. *G02B 5/3041* (2013.01); *G02B 1/18* (2015.01); *G02B 5/3033* (2013.01);
(Continued)

(58) Field of Classification Search
CPC .............................. G02B 5/3033; G02B 5/305
(Continued)

(56) References Cited

U.S. PATENT DOCUMENTS 6,565,974 B1    5/2003  Uchiyama et al.
7,023,510 B2 *  4/2006  Okamoto .......... G02F 1/133528
                                                    349/113
(Continued)

FOREIGN PATENT DOCUMENTS

CN    1926451 A     3/2007
CN    101393969 A   3/2009
(Continued)

OTHER PUBLICATIONS

International Search Report dated Feb. 16, 2016, issued in counterpart application No. PCT/JP2015/082368, w/ English translation. (5 pages).
(Continued)

*Primary Examiner* — William R Alexander
*Assistant Examiner* — Tamara Y. Washington
(74) *Attorney, Agent, or Firm* — Westerman, Hattori, Daniels & Adrian, LLP

(57) ABSTRACT

There is provided a circularly polarizing plate for an organic EL display apparatus, which has an excellent antireflection function and has an excellent organic EL panel-protecting function. A circularly polarizing plate according to the present invention is used in an organic EL display apparatus. The circularly polarizing plate includes in this order: a polarizer; a retardation layer functioning as a λ/4 plate; a barrier layer; and a pressure-sensitive adhesive layer having
(Continued)

a barrier function. An angle formed between an absorption axis of the polarizer and a slow axis of the retardation layer is from 35° to 55°.

7 Claims, 1 Drawing Sheet

(51) Int. Cl.
*H01L 51/52* (2006.01)
*G02B 1/18* (2015.01)
*H05B 33/04* (2006.01)

(52) U.S. Cl.
CPC ........ *G02B 5/3083* (2013.01); *H01L 51/5253* (2013.01); *H01L 51/5281* (2013.01); *H05B 33/04* (2013.01)

(58) Field of Classification Search
USPC .............................. 359/359, 487.02
See application file for complete search history.

(56) References Cited

U.S. PATENT DOCUMENTS

| | | | |
|---|---|---|---|
| 7,088,409 B2* | 8/2006 | Itou | G02F 1/133555 349/114 |
| 7,791,272 B2 | 9/2010 | Tamura et al. | |
| 8,033,882 B2 | 10/2011 | Tsukahara et al. | |
| 8,139,181 B2* | 3/2012 | Yoshihara | G02B 1/105 156/324 |
| 8,257,611 B2* | 9/2012 | Uehira | C07D 277/64 252/299.01 |
| 8,520,171 B2* | 8/2013 | Kitagawa | B29C 55/026 349/96 |
| 9,064,826 B2* | 6/2015 | Nakazawa | G02B 5/3025 |
| 9,203,051 B2 | 12/2015 | Byun et al. | |
| 9,240,569 B2 | 1/2016 | Fukuda | |
| 10,054,816 B2* | 8/2018 | Koike | G02F 1/13363 |
| 2007/0145889 A1 | 6/2007 | Tamura et al. | |
| 2009/0036667 A1* | 2/2009 | Hashimoto | B29C 55/045 536/69 |
| 2009/0040434 A1 | 2/2009 | Kawamoto et al. | |
| 2009/0072735 A1 | 3/2009 | Tsukahara et al. | |
| 2013/0038201 A1 | 2/2013 | Fukuda | |
| 2014/0332786 A1 | 11/2014 | Nakazawa | |
| 2015/0144909 A1 | 5/2015 | Byun et al. | |
| 2015/0253480 A1 | 9/2015 | Ren et al. | |

FOREIGN PATENT DOCUMENTS

| | | | | |
|---|---|---|---|---|
| CN | 102956671 A | | 3/2013 | |
| JP | 3325560 B2 | | 9/2002 | |
| JP | 2002-311239 A | | 10/2002 | |
| JP | 2002-372622 A | | 12/2002 | |
| JP | 2003-311239 A | | 11/2003 | |
| JP | 2005-216582 A | | 8/2005 | |
| JP | 2007-173084 A | | 7/2007 | |
| JP | 2009-94050 A | | 4/2009 | |
| JP | 2009094050 A | * | 4/2009 | |
| JP | 2013-38014 A | | 2/2013 | |
| JP | 2013038014 A | * | 2/2013 | ......... H01L 51/5281 |
| JP | 2015-103525 A | | 6/2015 | |
| TW | 201425344 A | | 7/2014 | |
| WO | 2013/054692 A1 | | 4/2013 | |
| WO | 2013/077220 A1 | | 5/2013 | |

OTHER PUBLICATIONS

Office Action dated Dec. 14, 2018, issued in counterpart CN application No. 201580062899.2, with English translation. (20 pages).

Office Action dated Apr. 10, 2019, issued in counterpart TW Application No. 104138617, with English translation. (12 pages).

Office Action dated Aug. 26, 2019, issued in counterpart CN application No. 201580062899.2, with English translation. (14 pages).

\* cited by examiner

CIRCULAR POLARIZATION PLATE FOR ORGANIC EL DISPLAY DEVICE AND ORGANIC EL DISPLAY DEVICE

TECHNICAL FIELD

The present invention relates to a circularly polarizing plate for an organic EL display apparatus and an organic EL display apparatus.

BACKGROUND ART

In recent years, a display mounted with an organic EL panel (an organic EL display apparatus) has been proposed in association with widespread use of a thin display. The organic EL panel is liable to cause problems, such as ambient light reflection and background reflection, because the panel includes a metal layer having high reflectivity. In view of the foregoing, it has been known that those problems are prevented by arranging a circularly polarizing plate on a viewer side (e.g., Patent Literatures 1 to 3). The organic EL panel is extremely weak against moisture and oxygen in the air, and hence a barrier layer (barrier film) is typically arranged on the surface of the organic EL panel. However, there has been a growing demand for the impartment of a barrier function to the circularly polarizing plate. Meanwhile, further thinning of the circularly polarizing plate has also been continuously demanded.

CITATION LIST

Patent Literature

[PTL 1] JP 2003-311239 A
[PTL 2] JP 2002-372622 A
[PTL 3] JP 3325560 B2

SUMMARY OF INVENTION

Technical Problem

The present invention has been made to solve the conventional problems, and a primary object of the present invention is to provide a circularly polarizing plate for an organic EL display apparatus, which has an excellent antireflection function and has an excellent organic EL panel-protecting function.

Solution to Problem

According to one aspect of the present invention, a circularly polarizing plate for an organic EL display apparatus is provided. The circularly polarizing plate includes in this order: a polarizer; a retardation layer functioning as a $\lambda/4$ plate; a barrier layer; and a pressure-sensitive adhesive layer having a barrier function, wherein an angle formed between an absorption axis of the polarizer and a slow axis of the retardation layer is from 35° to 55°.

In one embodiment of the invention, the circularly polarizing plate further includes another retardation layer functioning as a $\lambda/2$ plate between the polarizer and the retardation layer, wherein the angle formed between the absorption axis of the polarizer and the slow axis of the retardation layer is from 65° to 85°, and an angle formed between the absorption axis of the polarizer and a slow axis of the another retardation layer is from 10° to 20°.

In one embodiment of the invention, the circularly polarizing plate further includes a protective film between the polarizer and the retardation layer.

In one embodiment of the invention, the circularly polarizing plate further includes a protective film between the polarizer and the another retardation layer.

In one embodiment of the invention, the circularly polarizing plate further includes a protective film on a side of the polarizer opposite to the retardation layer.

In one embodiment of the invention, the polarizer is elongated and has the absorption axis in a longitudinal direction thereof; and the retardation layer is elongated and has the slow axis in a direction at from 35° to 55° relative to a longitudinal direction thereof.

In one embodiment of the invention, the polarizer is elongated and has the absorption axis in a longitudinal direction thereof; and the retardation layer and the another retardation layer are elongated, and the retardation layer has the slow axis in a direction at from 65° to 85° relative to a longitudinal direction thereof, and the another retardation layer has the slow axis in a direction at from 10° to 20° relative to a longitudinal direction thereof.

In one embodiment of the invention, a ratio K/I of a potassium content (wt %) to an iodine content (wt %) in the polarizer is from 0.180 to 0.235.

According to another aspect of the present invention, there is provided an organic EL display apparatus. The organic EL display apparatus includes the circularly polarizing plate.

Advantageous Effects of Invention

According to the present invention, an organic EL panel-protecting function can be imparted by forming the barrier layer on the surface of the retardation layer in the circularly polarizing plate for an organic EL display apparatus. Further, according to the present invention, the barrier layer can be formed while the optical characteristics and mechanical characteristics of the retardation film (retardation layer) are maintained within desired ranges. Accordingly, a circularly polarizing plate that achieves both an excellent antireflection function and an excellent organic EL panel-protecting function can be obtained. In addition, according to one embodiment of the present invention, only one $\lambda/4$ plate is used as the retardation layer and the $\lambda/4$ plate also functions as the inner protective film of the polarizer, and hence significant thinning of the circularly polarizing plate can be achieved.

DESCRIPTION OF EMBODIMENTS

Now, preferred embodiments of the present invention are described. However, the present invention is not limited to these embodiments.

Definitions of Terms and Symbols

The definitions of terms and symbols used herein are as follows.

(1) Refractive Indices (nx, ny, and nz)

A symbol "nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.

(2) In-Plane Retardation (Re)

The term "Re(λ)" refers to the in-plane retardation of a film measured at 23° C. with light having a wavelength of λ nm. For example, the term "Re(550)" refers to the in-plane retardation of the film measured at 23° C. with light having a wavelength of 550 nm. The Re(λ) is determined from the equation "Re=(nx−ny)×d" when the thickness of the film is represented by d (nm).

(3) Thickness Direction Retardation (Rth)

The term "Rth(λ)" refers to the thickness direction retardation of the film measured at 23° C. with light having a wavelength of λ nm. For example, the term "Rth(550)" refers to the thickness direction retardation of the film measured at 23° C. with light having a wavelength of 550 nm. The Rth(λ) is determined from the equation "Rth=(nx−nz)×d" when the thickness of the film is represented by d (nm).

(4) Nz Coefficient

An Nz coefficient is determined from the equation "Nz=Rth/Re".

A. Circularly Polarizing Plate

A-1. Entire Construction of Circularly Polarizing Plate

A circularly polarizing plate according to an embodiment of the present invention is used in an organic EL display apparatus. A circularly polarizing plate according to one embodiment of the present invention includes, in this order, a polarizer, a retardation layer functioning as a λ/4 plate, a barrier layer, and a pressure-sensitive adhesive layer having a barrier function. A circularly polarizing plate according to another embodiment of the present invention further includes another retardation layer functioning as a λ/2 plate between the polarizer and the retardation layer. The entire construction of the circularly polarizing plate is hereinafter specifically described for each of those typical embodiments, and then the respective layers and optical films constituting the circularly polarizing plate are described in detail.

Figure 1:
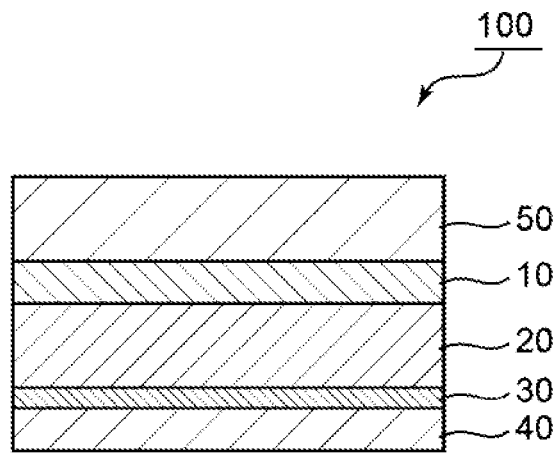
FIG. 1 is a schematic sectional view of a circularly polarizing plate according to one embodiment of the present invention.

FIG. 1 is a schematic sectional view of the circularly polarizing plate according to one embodiment of the present invention. A circularly polarizing plate 100 of this embodiment includes, a polarizer 10, a retardation layer 20, a barrier layer 30, and a pressure-sensitive adhesive layer 40 in the stated order. As described above, the retardation layer 20 functions as a λ/4 plate and the pressure-sensitive adhesive layer 40 has a barrier function. The circularly polarizing plate 100 of the illustrated example includes a protective film 50 on the side of the polarizer opposite to the retardation layer 20. In addition, the circularly polarizing plate may include another protective film (also referred to as "inner protective film": not shown) between the polarizer and the retardation layer. In the illustrated example, the inner protective film is omitted. In this case, the retardation layer 20 can also function as the inner protective film. Such construction can achieve further thinning of the circularly polarizing plate.

In this embodiment, an angle formed between the absorption axis of the polarizer 10 and the slow axis of the retardation layer 20 is from 35° to 55°, preferably from 38° to 52°, more preferably from 40° to 50°, still more preferably from 42° to 48°, particularly preferably from 44° to 46°. When the angle falls within such range, a desired circular polarization function can be achieved. When reference is made to an angle in this description, the angle includes angles in both clockwise and counterclockwise directions unless otherwise stated.

Figure 2:
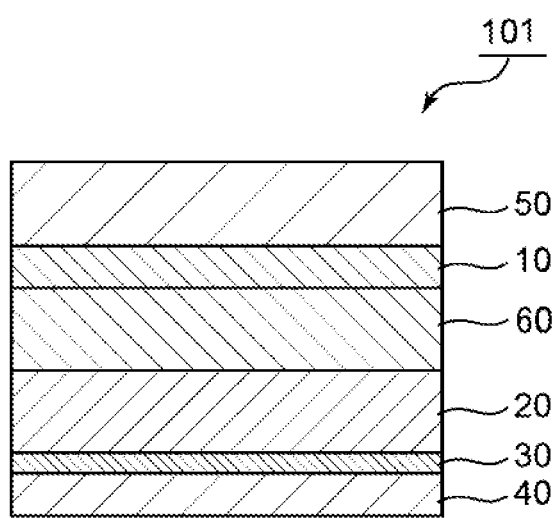
FIG. 2 is a schematic sectional view of a circularly polarizing plate according to another embodiment of the present invention.

FIG. 2 is a schematic sectional view of the circularly polarizing plate according to another embodiment of the present invention. A circularly polarizing plate 101 of this embodiment further includes another retardation layer 60 between the polarizer 10 and the retardation layer 20. The another retardation layer 60 functions as a λ/2 plate. In this embodiment, for convenience, the retardation layer 20 is referred to as "first retardation layer" and the another retardation layer 60 is referred to as "second retardation layer" in some cases. The circularly polarizing plate 101 of the illustrated example includes the protective film 50 on the side of the polarizer opposite to the second retardation layer. In addition, the circularly polarizing plate may include another protective film (also referred to as "inner protective film": not shown) between the polarizer and the second retardation layer. In the illustrated example, the inner protective film is omitted. In this case, the second retardation layer 60 can also function as the inner protective film.

In this embodiment, the angle formed between the absorption axis of the polarizer 10 and the slow axis of the first retardation layer 20 is preferably from 65° to 85°, more preferably from 72° to 78°, still more preferably about 75°. Further, an angle formed between the absorption axis of the polarizer 10 and the slow axis of the second retardation layer 60 is preferably from 10° to 20°, more preferably from 13° to 17°, still more preferably about 15°. When the two retardation layers are arranged at such axial angles as described above, a circularly polarizing plate having an extremely excellent circular polarization characteristic (as a result, an extremely excellent antireflection characteristic) in a wide wavelength range can be obtained.

A-2. Polarizer

Any appropriate polarizer may be adopted as the polarizer 10. Specific examples thereof include: a product obtained by subjecting a hydrophilic polymer film, such as a polyvinyl alcohol-based film, a partially formalized polyvinyl alcohol-based film, or an ethylene-vinyl acetate copolymer-based partially saponified film, to dyeing treatment with a dichromatic substance, such as iodine or a dichromatic dye, and stretching treatment; and a polyene-based alignment film, such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the resultant is preferably used because of its excellent optical characteristics.

The dyeing with iodine is performed by, for example, immersing the polyvinyl alcohol-based film in an aqueous solution of iodine. The stretching ratio of the uniaxial stretching is preferably from 3 times to 7 times. The stretching may be performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like. The polyvinyl alcohol-based film may be a single-layer film (film obtained by typical film forming), or may be a polyvinyl alcohol-based resin layer formed on a resin substrate by application. A technology for the production of the polarizer from the single-layer polyvinyl alcohol-based film is well known in the art. A technology for the production of the polarizer from the polyvinyl alcohol-based resin layer formed on the resin substrate by application is disclosed in, for example, JP 2009-098653 A.

The thickness of the polarizer is typically from about 1 μm to about 80 μm.

In one embodiment, a ratio K/I of a potassium content (wt %) to an iodine content (wt %) in the polarizer is preferably from 0.180 to 0.235, more preferably from 0.200 to 0.230. When the ratio K/I falls within such range, a polarizer having extremely excellent heat resistance can be obtained. As a result, a circularly polarizing plate that can achieve an organic EL display apparatus having extremely excellent durability can be obtained by a synergistic effect with the barrier properties of the barrier layer and the pressure-sensitive adhesive layer. In more detail, a circularly polarizing plate including a polarizer having such ratio K/I typically shows a small change in hue due to heating. For example, a variation in a value (Hunter color system) after the heating of the circularly polarizing plate at 95° C. for 500 hours is, for example, 7 or less, preferably 5 or less, more preferably 3 or less.

The polarizer preferably contains a zinc component. Examples of the zinc component include zinc chloride and zinc sulfate. The incorporation of the zinc component can provide a polarizer having more excellent durability.

A-3. Retardation Layer

As described above, the retardation layer 20 can function as a λ/4 plate. The in-plane retardation Re(550) of such retardation layer is from 100 nm to 180 nm, preferably from 110 nm to 170 nm, more preferably from 120 nm to 160 nm, particularly preferably from 135 nm to 155 nm. The retardation layer 20 typically has a refractive index ellipsoid of nx>ny=nz or nx>ny>nz. In this description, for example, the expression "ny=nz" includes not only the case where the ny and the nz are strictly equal to each other but also the case where the ny and the nz are substantially equal to each other. Therefore, the Nz coefficient of the retardation layer is, for example, from 0.9 to 2, preferably from 1 to 1.5, more preferably from 1 to 1.3.

The thickness of the retardation layer may be set so that the layer may function as a λ/4 plate most appropriately. In other words, the thickness may be set so that a desired in-plane retardation may be obtained. Specifically, the thickness is preferably from 10 μm to 80 μm, more preferably from 10 μm to 60 μm, most preferably from 30 μm to 50 μm.

The retardation layer may show such a reverse wavelength dispersion characteristic that its retardation value increases in accordance with an increase in wavelength of measurement light, may show such a positive wavelength dispersion characteristic that the retardation value reduces in accordance with an increase in wavelength of the measurement light, or may show such a flat wavelength dispersion characteristic that the retardation value remains substantially unchanged even when the wavelength of the measurement light changes. The retardation layer preferably shows a flat wavelength dispersion characteristic. The adoption of a λ/4 plate (retardation layer) having a flat wavelength dispersion characteristic can achieve an excellent antireflection characteristic and an excellent reflection hue in an oblique direction. The retardation layer preferably has a ratio Re(450)/Re(550) of from 0.99 to 1.03, and preferably has a ratio Re(650)/Re(550) of from 0.98 to 1.02.

The retardation layer may include any appropriate resin film that can satisfy such optical characteristics and mechanical characteristics as described above. Typical examples of such resin include resins, for example, transparent resins, such as a cellulose-based resin, a polyester-based resin, a polyvinyl alcohol-based resin, a polyvinyl acetal-based resin, a polycarbonate-based resin, a polyamide-based resin, a polyimide-based resin, a polyether sulfone-based resin, a polyether-based resin, a polysulfone-based resin, a polystyrene-based resin, a cyclic olefin-based resin (a polynorbornene-based resin), a polyolefin-based resin, an acrylic resin, a urethane-based resin, an acrylic urethane-based resin, and an acetate-based resin. In an embodiment in which the retardation layer 20 is used alone, the retardation layer 20 may be preferably formed of a polycarbonate resin. The polycarbonate resin that may be used in this embodiment contains at least a constituent unit derived from a dihydroxy compound having a bond structure represented by the following structural formula (1), and is produced by causing a dihydroxy compound including at least a dihydroxy compound having at least one bond structure —CH$_2$—O— in a molecule thereof and a carbonic acid diester to react with each other in the presence of a polymerization catalyst.

(1)

A compound of any structure may be used as the dihydroxy compound having a bond structure represented by the structural formula (1) as long as the compound has two alcoholic hydroxy groups, contains a structure having a linking group —CH$_2$—O— in a molecule thereof, and can react with the carbonic acid diester in the presence of the polymerization catalyst to produce the polycarbonate resin. Two or more kinds of such compounds may be used in combination. In addition, a dihydroxy compound free of any bond structure represented by the structural formula (1) may be used as a dihydroxy compound to be used in the polycarbonate resin in combination with the above-mentioned dihydroxy compound. The dihydroxy compound having a bond structure represented by the structural formula (1) is hereinafter abbreviated as "dihydroxy compound (A)" and the dihydroxy compound free of any bond structure represented by the structural formula (1) is abbreviated as "dihydroxy compound (B)" in some cases.

<Dihydroxy Compound (A)>

The "linking group —CH$_2$—O—" in the dihydroxy compound (A) means a structure that is bonded to an atom except a hydrogen atom to constitute a molecule. An atom to which at least an oxygen atom in the linking group can be bonded, or each of atoms to which a carbon atom and the oxygen atom therein can be simultaneously bonded, is most preferably a carbon atom. The number of the "linking groups —CH$_2$—O—" in the dihydroxy compound (A) is 1 or more, preferably from 2 to 4.

More specific examples of the dihydroxy compound (A) include: compounds each having an aromatic group in a side chain and an ether group bonded to an aromatic group in a main chain, such as 9,9-bis(4-(2-hydroxyethoxy)phenyl) fluorene, 9,9-bis(4-(2-hydroxyethoxy)-3-methylphenyl) fluorene, 9,9-bis(4-(2-hydroxyethoxy)-3-isopropylphenyl) fluorene, 9,9-bis(4-(2-hydroxyethoxy)-3-isobutylphenyl) fluorene, 9,9-bis(4-(2-hydroxyethoxy)-3-tert-butylphenyl)

fluorene, 9,9-bis(4-(2-hydroxyethoxy)-3-cyclohexylphenyl) fluorene, 9,9-bis(4-(2-hydroxyethoxy)-3-phenylphenyl) fluorene, 9,9-bis(4-(2-hydroxyethoxy)-3,5-dimethylphenyl) fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene; bis(hydroxyalkoxyaryl) alkanes, such as bis[4-(2-hydroxyethoxy)phenyl]methane, bis[4-(2-hydroxyethoxy)phenyl]diphenylmethane, 1,1-bis[4-(2-hydroxyethoxy)phenyl]ethane, 1,1-bis[4-(2-hydroxyethoxy)phenyl]-1-phenylethane, 2,2-bis[4-(2-hydroxyethoxy)phenyl]propane, 2,2-bis[4-(2-hydroxyethoxy)-3-methylphenyl]propane, 2,2-bis[3,5-dimethyl-4-(2-hydroxyethoxy)phenyl]propane, 1,1-bis[4-(2-hydroxyethoxy)phenyl]-3,3,5-trimethylcyclohexane, 1,1-bis[4-(2-hydroxyethoxy)phenyl]cyclohexane, 1,4-bis[4-(2-hydroxyethoxy)phenyl]cyclohexane, 1,3-bis[4-(2-hydroxyethoxy)phenyl]cyclohexane, 2,2-bis[4-(2-hydroxyethoxy)-3-phenylphenyl]propane, 2,2-bis[(2-hydroxyethoxy)-3-isopropylphenyl]propane, 2,2-bis[3-tert-butyl-4-(2-hydroxyethoxy)phenyl]propane, 2,2-bis[4-(2-hydroxyethoxy)phenyl]butane, 2,2-bis[4-(2-hydroxyethoxy)phenyl]-4-methylpentane, 2,2-bis[4-(2-hydroxyethoxy)phenyl]octane, 1,1-bis[4-(2-hydroxyethoxy)phenyl]decane, 2,2-bis[3-bromo-4-(2-hydroxyethoxy)phenyl]propane, and 2,2-bis[3-cyclohexyl-4-(2-hydroxyethoxy)phenyl]propane; bis(hydroxyalkoxyaryl) cycloalkanes, such as 1,1-bis[4-(2-hydroxyethoxy)phenyl]cyclohexane, 1,1-bis[3-cyclohexyl-4-(2-hydroxyethoxy) phenyl]cyclohexane, and 1,1-bis[4-(2-hydroxyethoxy)phenyl]cyclopentane; dihydroxyalkoxydiaryl ethers, such as 4,4'-bis(2-hydroxyethoxy)diphenyl ether and 4,4'-bis(2-hydroxyethoxy)-3,3'-dimethyl diphenyl ether; bishydroxyalkoxyaryl sulfides, such as 4,4'-bis(2-hydroxyethoxyphenyl) sulfide and 4,4'-bis[4-(2-dihydroxyethoxy)-3-methylphenyl] sulfide; bishydroxyalkoxyaryl sulfoxides, such as 4,4'-bis(2-hydroxyethoxyphenyl) sulfoxide and 4,4'-bis[4-(2-dihydroxyethoxy)-3-methylphenyl] sulfoxide; bishydroxyalkoxyaryl sulfones, such as 4,4'-bis(2-hydroxyethoxyphenyl)sulfone and 4,4'-bis[4-(2-dihydroxyethoxy)-3-methylphenyl]sulfone; and 1,4-bishydroxyethoxybenzene, 1,3-bishydroxyethoxybenzene, 1,2-bishydroxyethoxybenzene, 1,3-bis[2-[4-(2-hydroxyethoxy)phenyl]propyl]benzene, 1,4-bis[2-[4-(2-hydroxyethoxy)phenyl]propyl]benzene, 4,4'-bis(2-hydroxyethoxy) biphenyl, 1,3-bis[4-(2-hydroxyethoxy)phenyl]-5,7-dimethyladamantane, anhydrous sugar alcohols typified by a dihydroxy compound represented by the following formula (4), and compounds each having a cyclic ether structure, such as a spiroglycol represented by the following general formula (6). Those compounds may be used alone or in combination thereof.

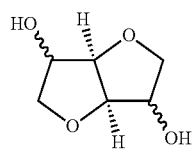

(4)

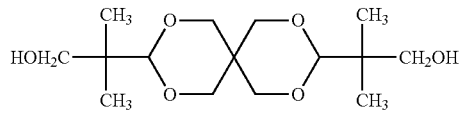

(6)

Those dihydroxy compounds (A) may be used alone or in combination thereof. The dihydroxy compound represented by the formula (4) comes in isosorbide, isomannide, and isoidide that are in a stereoisomer relationship. Those compounds may be used alone or in combination thereof.

A usage ratio between the dihydroxy compound represented by the formula (4) and any other dihydroxy compound is as described later as a ratio between constituent units derived from the respective dihydroxy compounds constituting the polycarbonate resin. Of those dihydroxy compounds (A), isosorbide obtained by the dehydration condensation of sorbitol produced from various starches that are abundant as resources and are hence easily available is most preferred in terms of the ease of availability and the ease of production, optical characteristics, and formability.

Isosorbide is liable to be gradually oxidized by oxygen. Accordingly, it is important that when the isosorbide is stored or handled at the time of the production of the polycarbonate resin, a deoxidant be used or a nitrogen atmosphere be established for preventing its decomposition due to oxygen. In addition, it is necessary that moisture be prevented from being included in the isosorbide. The oxidation of the isosorbide produces decomposition products typified by formic acid. For example, when the polycarbonate resin is produced by using isosorbide containing those decomposition products, the decomposition products are responsible for the occurrence of the coloring of the polycarbonate resin to be obtained or for remarkable deterioration of its physical properties. In addition, the decomposition products affect a polymerization reaction and hence a polymer having a high molecular weight is not obtained in some cases.

Further, when a stabilizer that prevents the occurrence of formic acid is added to isosorbide, depending on the kind of the stabilizer, the coloring of the polycarbonate resin to be obtained occurs or its physical properties are remarkably deteriorated in some cases. A reducing agent or an antacid is used as the stabilizer. Of those, the reducing agent is, for example, sodium borohydride or lithium borohydride, and the antacid is, for example, sodium hydroxide. However, when such alkali metal salt is added, its alkali metal also serves as a polymerization catalyst. Accordingly, excessive addition of the salt may preclude the control of the polymerization reaction.

In order to obtain isosorbide free of any oxidative decomposition product, isosorbide may be distilled as required. In addition, also in the case where a stabilizer is compounded for preventing the oxidation or decomposition of the isosorbide, the isosorbide may be distilled as required in order that the stabilizer may be removed. In this case, the distillation of the isosorbide may be simple distillation or may be continuous distillation, and is not particularly limited. With regard to the atmosphere under which the distillation is performed, after an inert gas atmosphere, such as argon or nitrogen, has been established, the distillation is performed under reduced pressure.

For example, when isosorbide is subjected to such distillation, its purity may be set to such a high value that its formic acid content is less than 20 ppm, preferably 10 ppm or less, more preferably 5 ppm or less, still more preferably 3 ppm or less, or the isosorbide is particularly preferably completely free of formic acid. Simultaneously, the purity may be set to such a high value that the content of an alkali metal compound and/or an alkaline earth metal compound with respect to 1 mol of the isosorbide is 10 μmol or less, preferably 5 μmol or less, more preferably 3 μmol or less, still more preferably 1 μmol or less in terms of a metal, or the isosorbide is particularly preferably completely free of any alkali metal compound and/or any alkaline earth metal compound.

In the polycarbonate resin to be used in the present invention, the dihydroxy compound (A), such as a dihydroxy compound represented by the general formula (1), having a formic acid content of less than 20 ppm is preferably used. Further, the formic acid content is preferably 10 ppm or less, more preferably 5 ppm or less, still more preferably 3 ppm or less, or the dihydroxy compound (A) is particularly preferably completely free of formic acid produced by its decomposition or the like. When the dihydroxy compound (A), such as the dihydroxy compound represented by the formula (4), having such high purity is used as a raw material, a problem in the polymerization reaction to be described later is solved, and hence a high-quality polycarbonate resin further suppressed in coloring and the like can be stably and efficiently produced.

Although specific means for subjecting the dihydroxy compound (A), such as the dihydroxy compound represented by the formula (4), having small contents of formic acid, and the alkali metal compound and/or the alkaline earth metal compound as described above to the reaction with the carbonic acid diester is not particularly limited, for example, the following method may be adopted.

The dihydroxy compound (A), such as the dihydroxy compound represented by the formula (4), having a high purity is preferably stored under an atmosphere where oxygen is absent, such as an inert gas atmosphere, or a reduced-pressure or vacuum atmosphere, until a time point immediately before the reaction with the carbonic acid diester. When the compound is stored under an environment at 40° C. and 80% RH after having been removed from the storage state, the compound is supplied to a reaction system with the carbonic acid diester typically within 2 weeks, more preferably within 1 week. In the case of the storage under the environment at 40° C. and 80% RH, even when the dihydroxy compound represented by the formula (4) is left to stand in air for typically 2 weeks or less, preferably 1 week or less, the polymerization is not inhibited. When the temperature and the humidity are less than 40° C. and 80% RH, respectively, the storage period can be lengthened.

The term "under the inert gas atmosphere" as used herein means, for example, that the compound is stored under an atmosphere containing one or two or kinds of gases, such as nitrogen and argon, the atmosphere having an oxygen content of 1,000 ppm or less, especially an atmosphere completely free of oxygen, and the term "under the reduced-pressure atmosphere" means, for example, that the compound is stored under an atmosphere having a pressure of 13.3 kPa or less and an oxygen content of 100 ppm or less. In the storage system, a deoxidant using iron powder as a main component, for example, a deoxidant, such as AGE-LESS (manufactured by Mitsubishi Gas Chemical Company, Inc.) or OXY-EATER (manufactured by Ueno Fine Chemicals Industry, Ltd.), or a drying agent, such as silica gel, a molecular sieve, or aluminum oxide, may be caused to coexist as required.

In addition, the oxidation of the dihydroxy compound (A), such as isosorbide, produces decomposition products typified by formic acid, and hence it is effective to store the compound at low temperature so that the decomposition products may not be produced.

As long as the storage temperature is 40° C. or less, when an environment having an oxygen concentration of 1,000 ppm or less is maintained under an inert gas atmosphere by causing a deoxidant to coexist, the compound can be subjected to the polymerization for at least 1 month. The storage temperature is 40° C. or less, preferably 25° C. or less, more preferably 10° C. or less, particularly preferably 5° C. or less.

Although powdery or flaky isosorbide can be stored under a humidity as high as 80% RH, its mass may change owing to moisture absorption. Accordingly, the isosorbide is preferably hermetically stored in an aluminum moisture barrier bag or the like, or stored under an inert gas atmosphere so as not to absorb moisture.

Further, those conditions may be appropriately used in combination.

When the dihydroxy compound (A), such as the dihydroxy compound represented by the formula (4), is subjected to the reaction with the carbonic acid diester to be described later, the form of the compound is not particularly limited, and may be a powder form, may be a flake form, or may be a liquid form, such as a molten state or an aqueous solution.

<Dihydroxy Compound (B)>

In the polycarbonate resin, a dihydroxy compound (B), which is a dihydroxy compound except the dihydroxy compound (A), may be used as the dihydroxy compound. As the dihydroxy compound (B), for example, an alicyclic dihydroxy compound, an aliphatic dihydroxy compound, an oxyalkylene glycol, an aromatic dihydroxy compound, or a diol having a cyclic ether structure may be used as the dihydroxy compound serving as a structural unit of polycarbonate, in combination with the dihydroxy compound (A), such as the dihydroxy compound represented by the formula (4).

Although the alicyclic dihydroxy compound that may be used in the polycarbonate resin is not particularly limited, a compound typically containing a five-membered ring structure or a six-membered ring structure is preferably used. In addition, the six-membered ring structure may be fixed in a chair shape or a boat shape by a covalent bond. When the alicyclic dihydroxy compound has the five-membered ring or six-membered ring structure, the heat resistance of the polycarbonate resin to be obtained can be improved. The number of carbon atoms in the alicyclic dihydroxy compound is typically 70 or less, preferably 50 or less, more preferably 30 or less. As the value increases, the heat resistance is improved. However, it becomes difficult to synthesize the compound, it becomes difficult to purify the compound, or cost for the compound increases. As the number of carbon atoms reduces, it becomes easy to purify the compound and the compound becomes more easily available.

Specific examples of the alicyclic dihydroxy compound containing a five-membered ring structure or a six-membered ring structure include alicyclic dihydroxy compounds each represented by the following general formula (II) or (III):

$$HOCH_2-R^1-CH_2OH \quad (II)$$

$$HO-R^2-OH \quad (III)$$

in the formulae (II) and (III), $R^1$ and $R^2$ each represent a cycloalkylene group having 4 to 20 carbon atoms.

Cyclohexanedimethanol serving as the alicyclic dihydroxy compound represented by the general formula (II) encompasses various isomers in each of which $R^1$ in the general formula (II) is represented by the following general formula (IIa), where $R^3$ represents an alkyl group having 1 to 12 carbon atoms or a hydrogen atom. Specific examples thereof include 1,2-cyclohexanedimethanol, 1,3-cyclohexanedimethanol, and 1,4-cyclohexanedimethanol.

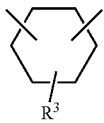

(IIa)

Tricyclodecanedimethanol or pentacyclopentadecanedimethanol serving as the alicyclic dihydroxy compound represented by the general formula (II) encompasses various isomers in each of which $R^1$ in the general formula (II) is represented by the following general formula (IIb), where n represents 0 or 1.

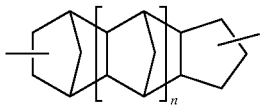

(IIb)

Decalindimethanol or tricyclotetradecanedimethanol serving as the alicyclic dihydroxy compound represented by the general formula (II) encompasses various isomers in each of which $R^1$ in the general formula (II) is represented by the following general formula (IIc), where m represents 0 or 1. Specific examples thereof include 2,6-decalindimethanol, 1,5-decalindimethanol, and 2,3-decalindimethanol.

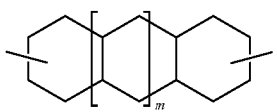

(IIc)

In addition, norbornanedimethanol serving as the alicyclic dihydroxy compound represented by the general formula (II) encompasses various isomers in each of which $R^1$ in the general formula (II) is represented by the following general formula (IId). Specific examples thereof include 2,3-norbornanedimethanol and 2,5-norbornanedimethanol.

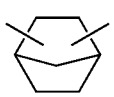

(IId)

Adamantanedimethanol serving as the alicyclic dihydroxy compound represented by the general formula (II) encompasses various isomers in each of which $R^1$ in the general formula (II) is represented by the following general formula (IIe). A specific example thereof is 1,3-adamantanedimethanol.

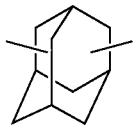

(IIe)

In addition, cyclohexanediol serving as the alicyclic dihydroxy compound represented by the general formula (III) encompasses various isomers in each of which $R^2$ in the general formula (III) is represented by the following general formula (IIIa), where $R^3$ represents an alkyl group having 1 to 12 carbon atoms or a hydrogen atom. Specific examples thereof include 1,2-cyclohexanediol, 1,3-cyclohexanediol, 1,4-cyclohexanediol, and 2-methyl-1,4-cyclohexanediol.

(IIIa)

Tricyclodecanediol or pentacyclopentadecanediol serving as the alicyclic dihydroxy compound represented by the general formula (III) encompasses various isomers in each of which $R^2$ in the general formula (III) is represented by the following general formula (IIIb), where n represents 0 or 1.

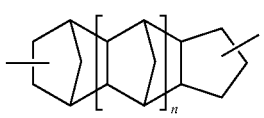

(IIIb)

Decalindiol or tricyclotetradecanediol serving as the alicyclic dihydroxy compound represented by the general formula (III) encompasses various isomers in each of which $R^2$ in the general formula (III) is represented by the following general formula (IIIc), where m represents 0 or 1. As the decalindiol or the tricyclotetradecanediol, there may be specifically used, for example, 2,6-decalindiol, 1,5-decalindiol, or 2,3-decalindiol.

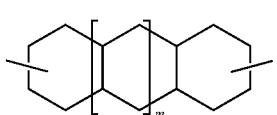

(IIIc)

Norbornanediol serving as the alicyclic dihydroxy compound represented by the general formula (III) encompasses various isomers in each of which $R^2$ in the general formula (III) is represented by the following general formula (IIId). As the norbornanediol, there may be specifically used, for example, 2,3-norbornanediol or 2,5-norbornanediol.

(IIId)

Adamantanediol serving as the alicyclic dihydroxy compound represented by the general formula (III) encompasses various isomers in each of which R² in the general formula (III) is represented by the following general formula (IIIe). As the adamantanediol, there may be specifically used, for example, 1,3-adamantanediol.

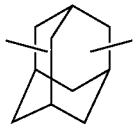

(IIIe)

Of the above-mentioned specific examples of the alicyclic dihydroxy compound, in particular, cyclohexanedimethanols, tricyclodecanedimethanols, adamantanediols, and pentacyclopentadecanedimethanols are preferred, and 1,4-cyclohexanedimethanol, 1,3-cyclohexanedimethanol, 1,2-cyclohexanedimethanol, and tricyclodecanedimethanol are preferred from the viewpoints of the ease of availability and the ease of handling.

Examples of the aliphatic dihydroxy compound that may be used include ethylene glycol, 1,3-propanediol, 1,2-propanediol, 1,4-butanediol, 1,3-butanediol, 1,2-butanediol, 1,5-heptanediol, and 1,6-hexanediol.

Examples of the oxyalkylene glycols that may be used include diethylene glycol, triethylene glycol, tetraethylene glycol, and polyethylene glycol.

Examples of the aromatic dihydroxy compound that may be used include 2,2-bis(4-hydroxyphenyl)propane [=bisphenol A], 2,2-bis(4-hydroxy-3,5-dimethylphenyl)propane, 2,2-bis(4-hydroxy-3,5-diethylphenyl)propane, 2,2-bis(4-hydroxy-(3,5-diphenyl)phenyl)propane, 2,2-bis(4-hydroxy-3,5-dibromophenyl)propane, 2,2-bis(4-hydroxyphenyl)pentane, 2,4'-dihydroxy-diphenylmethane, bis(4-hydroxyphenyl)methane, bis(4-hydroxy-5-nitrophenyl)methane, 1,1-bis(4-hydroxyphenyl)ethane, 3,3-bis(4-hydroxyphenyl)pentane, 1,1-bis(4-hydroxyphenyl)cyclohexane, bis(4-hydroxyphenyl)sulfone, 2,4'-dihydroxydiphenyl sulfone, bis(4-hydroxyphenyl) sulfide, 4,4'-dihydroxydiphenyl ether, 4,4'-dihydroxy-3,3'-dichlorodiphenyl ether, 4,4'-dihydroxy-2,5-diethoxydiphenyl ether, 9,9-bis[4-(2-hydroxyethoxy)phenyl]fluorene, 9,9-bis[4-(2-hydroxyethoxy-2-methyl)phenyl]fluorene, 9,9-bis(4-hydroxyphenyl)fluorene, and 9,9-bis(4-hydroxy-2-methylphenyl)fluorene.

Examples of the diol having a cyclic ether structure that may be used include spiroglycols and dioxane glycols.

The exemplified compounds are examples of the alicyclic dihydroxy compound, the aliphatic dihydroxy compound, the oxyalkylene glycol, the aromatic dihydroxy compound, and the diol having a cyclic ether structure that may be used in the present invention, and the dihydroxy compound (B) is by no means limited thereto. One or two or more kinds of those compounds may be used together with the dihydroxy compound represented by the formula (4).

The use of any such dihydroxy compound (B) can provide effects, such as an improvement in flexibility, an improvement in heat resistance, and an improvement in formability, in accordance with applications. Although the ratio of the dihydroxy compound (A), such as the dihydroxy compound represented by the formula (4), to all the dihydroxy compounds constituting the polycarbonate resin is not particularly limited, the ratio is preferably 10 mol % or more, more preferably 40 mol % or more, still more preferably 60 mol % or more, and is preferably 90 mol % or less, more preferably 80 mol % or less, still more preferably 70 mol % or less. When the content of a constituent unit derived from any other dihydroxy compound is excessively large, the performance of the resin, such as optical characteristics, may be reduced.

When the alicyclic dihydroxy compound out of the other dihydroxy compounds is used, the ratio of the total of the dihydroxy compound (A), such as the dihydroxy compound represented by the formula (4), and the alicyclic dihydroxy compound to all the dihydroxy compounds constituting the polycarbonate resin is not particularly limited, but is preferably 80 mol % or more, more preferably 90 mol % or more, particularly preferably 95 mol % or more.

In addition, although a content ratio between a constituent unit derived from the dihydroxy compound (A), such as the dihydroxy compound represented by the formula (4), and a constituent unit derived from the alicyclic dihydroxy compound in the polycarbonate resin may be selected from any appropriate ratios, a ratio "constituent unit derived from the dihydroxy compound represented by the formula (4):constituent unit derived from the alicyclic dihydroxy compound" is preferably from 1:99 to 99:1 (mol %), and the ratio "constituent unit derived from the dihydroxy compound represented by the formula (4):constituent unit derived from the alicyclic dihydroxy compound" is particularly preferably from 10:90 to 90:10 (mol %). When the content of the constituent unit derived from the dihydroxy compound represented by the formula (4) exceeds the range and the content of the constituent unit derived from the alicyclic dihydroxy compound falls below the range, the coloring of the resin is liable to occur. In contrast, when the content of the constituent unit derived from the dihydroxy compound represented by the formula (4) falls below the range and the content of the constituent unit derived from the alicyclic dihydroxy compound exceeds the range, the following tendency is observed: the molecular weight of the resin hardly increases.

Further, when the aliphatic dihydroxy compound, the oxyalkylene glycol, the aromatic dihydroxy compound, and the diol having a cyclic ether structure are used, the ratio of the total of the dihydroxy compound (A), such as the dihydroxy compound represented by the formula (4), and the respective dihydroxy compounds to all the dihydroxy compounds constituting the polycarbonate resin is not particularly limited, and may be selected from any appropriate ratios. In addition, a content ratio between the constituent unit derived from the dihydroxy compound (A), such as the dihydroxy compound represented by the formula (4), and a constituent unit derived from each of those dihydroxy compounds is also not particularly limited, and may be selected from any appropriate ratios.

Here, the polymerization degree of the polycarbonate resin having the constituent units derived from the dihydroxy compounds (which is hereinafter sometimes referred to as "polycarbonate copolymer") is preferably 0.40 dl/g or more, more preferably 0.43 dl/g or more in terms of a reduced viscosity measured as follows: a solution is precisely prepared by using a mixed solution containing phenol and 1,1,2,2-tetrachloroethane at a mass ratio of 1:1 as a solvent so as to have a polycarbonate concentration of 1.00 g/dl, and its reduced viscosity is measured at a temperature of 30.0° C.±0.1° C. (the reduced viscosity is hereinafter simply referred to as "reduced viscosity of the polycarbonate"). In addition, the polymerization degree is typically 2.00 dl/g or less, preferably 1.60 dl/g or less. When the reduced viscosity of the polycarbonate is excessively low, the mechanical strength of a molded article obtained by molding the polycarbonate copolymer is weak in many cases. In addition, when the reduced viscosity of the polycarbonate increases, the following tendency is observed: the flowability of the polycarbonate copolymer at the time of the molding reduces to reduce its cycle characteristic and to lengthen its molding cycle, and the birefringence of the molded article to be obtained is liable to be large.

In addition, the Abbe number of the polycarbonate resin is preferably 20 or more, more preferably 50 or more, particularly preferably 55 or more. As the value increases, the wavelength dispersion of a refractive index of the resin reduces and hence a chromatic aberration reduces. Accordingly, the resin becomes suitable as an optical film. As the Abbe number reduces, the wavelength dispersion of the refractive index increases and hence the chromatic aberration increases. Therefore, the value for the Abbe number is preferably as large as possible, and an upper limit therefor is not particularly limited.

In addition, the 5% thermal weight loss temperature of the polycarbonate resin is preferably 340° C. or more, more preferably 345° C. or more. As the 5% thermal weight loss temperature increases, the resin is improved in thermal stability and hence can be used at higher temperatures. In addition, the temperature at which the resin is produced can be increased and hence a temperature control width at the time of the production can be widened. Accordingly, the production is facilitated. As the 5% thermal weight loss temperature reduces, the thermal stability reduces and hence it becomes difficult to use the resin at high temperatures. In addition, an allowable width for the control at the time of the production narrows to make it difficult to produce the resin. Therefore, an upper limit for the 5% thermal weight loss temperature is not particularly limited, and the temperature is desirably as high as possible. The decomposition temperature of the copolymer serves as the upper limit.

In addition, the Izod impact strength of the polycarbonate resin is preferably 30 J/m$^2$ or more. An upper limit for the Izod impact strength is not particularly limited because as the Izod impact strength increases, a molded body obtained by molding the resin is increased in strength and hence becomes less likely to break.

In addition, in the polycarbonate resin, the amount of a produced gas except a phenol component at 110° C. per unit area (hereinafter sometimes simply referred to as "amount of a produced gas") is preferably 5 ng/cm$^2$ or less, and the amount of a produced gas derived from a dihydroxy compound except the dihydroxy compound represented by the formula (4) is more preferably 0.5 ng/cm$^2$ or less.

When the polycarbonate resin is subjected to differential scanning calorimetry (DSC), the resin provides a single glass transition temperature. However, when the kinds of the dihydroxy compound represented by the formula (4) and the alicyclic dihydroxy compound, and a compounding ratio therebetween are adjusted, the glass transition temperature can be adjusted, i.e., the resin can be obtained as a polymer having any appropriate glass transition temperature ranging from, for example, about 45° C. to about 155° C. in accordance with applications.

In a film application, flexibility is typically required. Accordingly, the glass transition temperature of the polycarbonate resin is preferably adjusted to 45° C. or more, for example, from 45° C. to 130° C.

The polycarbonate resin preferably has at least two of the physical properties at the same time, and more preferably further has any other physical property together therewith.

The polycarbonate resin may be produced by a melt polymerization method involving causing the dihydroxy compounds including the dihydroxy compound (A) to react with the carbonic acid diester in the presence of the polymerization catalyst.

<Carbonic Acid Diester>

Examples of the carbonic acid diester to be used in the method of producing the polycarbonate resin include diphenyl carbonate, substituted diphenyl carbonates typified by ditolyl carbonate, dimethyl carbonate, diethyl carbonate, and di-t-butyl carbonate, particularly preferably diphenyl carbonate and substituted diphenyl carbonates. Those carbonic acid diesters may be used alone or as a mixture thereof.

The carbonic acid diester is preferably used at a molar ratio of from 0.90 to 1.10 with respect to all the dihydroxy compounds to be used in the reaction, and is more preferably used at a molar ratio of from 0.96 to 1.04. When the molar ratio becomes less than 0.90, the amount of a terminal OH group of the produced polycarbonate resin increases, and hence the thermal stability of the polymer deteriorates or a desired polymer is not obtained in some cases. In addition, when the molar ratio becomes more than 1.10, under the same conditions, the rate of an ester exchange reaction reduces and hence it becomes difficult to produce a polycarbonate resin having a desired molecular weight. Moreover, the amount of the carbonic acid diester remaining in the produced polycarbonate copolymer increases, and the remaining carbonic acid diester may be responsible for an odor at the time of the molding of the copolymer or in a molded article thus obtained.

In an embodiment in which the first retardation layer 20 and the second retardation layer 60 to be described later are used in combination, the retardation layer 20 may be preferably formed of a cyclic olefin-based resin. The cyclic olefin-based resin is a generic term for resins each polymerized by using a cyclic olefin as a polymerization unit, and examples thereof include resins disclosed in JP 01-240517 A, JP 03-14882 A, and JP 03-122137 A. Specific examples thereof include: a ring-opening (co)polymer of the cyclic olefin, an addition polymer of the cyclic olefin, a copolymer (typically a random copolymer) of the cyclic olefin and an α-olefin, such as ethylene or propylene, and graft-modified products obtained by modifying the polymers with unsaturated carboxylic acids or derivatives thereof; and hydrogenated products thereof. Specific examples of the cyclic olefin include norbornene-based monomers. Examples of the norbornene-based monomers include: norbornene, alkyl and/or alkylidene substituted products thereof, such as κ-methyl-2-norbornene, 5-dimethyl-2-norbornene, 5-ethyl-2-norbornene, 5-butyl-2-norbornene, and 5-ethylidene-2-norbornene, and polar group (e.g., halogen) substituted products thereof; dicyclopentadiene and 2,3-dihydrodicyclopentadiene; dimethanooctahydronaphthalene, alkyl and/or alkylidene substituted products thereof, and polar group (e.g., halogen) substituted products thereof, such as 6-methyl-1,4:5,8-dimethano-1,4,4a,5,6,7,8,8a-octahydronaphthalene, 6-ethyl-1,4:5,8-dimethano-1,4,4a,5,6,7,8,8a-octahydronaphthalene, 6-ethylidene-1,4:5,8-dimethano-1,4,4a,5,6,7,8,8a-octahydronaphthalene, 6-chloro-1,4:5,8-dimethano-1,4,4a,5,6,7,8,8a-octahydronaphthalene, 6-cyano-1,4:5,8-dimethano-1,4,4a,5,6,7,8,8a-octahydronaphthalene, 6-pyridyl-1,4:5,8-dimethano-1,4,4a,5,6,7, 8,8a-octahydronaphthalene, and 6-methoxycarbonyl-1,4:5, 8-dimethano-1,4,4a,5,6,7,8,8a-octahydronaphthalene; and trimers or tetramers of cyclopentadiene, such as 4,9:5,8-dimethano-3a,4,4a,5,8,8a,9,9a-octahydro-1H-benzoindene and 4,11:5,10:6,9-trimethano-3a,4,4a,5,5a,6,9,9a,10,10a,11,11a-dodecahydro-1H-cyclopentaanthracene.

In the present invention, any other cycloolefin that may be subjected to ring-opening polymerization may be used in combination with the cycloolefin to the extent that the object of the present invention is not impaired. Specific examples of such cycloolefin include compounds each having one reactive double bond, such as cyclopentene, cyclooctene, and 5,6-dihydrodicyclopentadiene.

The number-average molecular weight (Mn) of the cyclic olefin-based resin measured by a gel permeation chromatograph (GPC) method based on a toluene solvent is preferably from 25,000 to 200,000, more preferably from 30,000 to 100,000, most preferably from 40,000 to 80,000. When the number-average molecular weight falls within the range, a film that is excellent in mechanical strength and has satisfactory solubility, satisfactory formability, and satisfactory casting operability can be obtained.

The retardation layer 20 is obtained by, for example, stretching a film formed from the resin. Any appropriate molding processing method may be adopted as a method of forming a film from the resin. Specific examples thereof include a compression molding method, a transfer molding method, an injection molding method, an extrusion molding method, a blow molding method, a powder forming method, an FRP molding method, a cast coating method (e.g., a casting method), a calender molding method, and a hot-press method. Of those, an extrusion molding method or a cast coating method is preferred. This is because the extrusion molding method or the cast coating method can increase the smoothness of the film to be obtained and provide satisfactory optical uniformity. Forming conditions may be appropriately set depending on, for example, the composition and kind of the resin to be used and desired characteristics of the retardation layer. Many film products are commercially available as the resin, and hence any one of the commercial films may be subjected as it is to stretching treatment.

The stretching ratio of the film may vary depending on, for example, a desired in-plane retardation value and a desired thickness of the retardation layer, the kind of the resin to be used, the thickness of the film to be used, and a stretching temperature. Specifically, the stretching ratio is preferably from 1.75 times to 3.00 times, more preferably from 1.80 times to 2.80 times, most preferably from 1.85 times to 2.60 times. When the film is stretched at such ratio, a retardation layer having an in-plane retardation with which the effects of the present invention can be appropriately exhibited can be obtained.

The stretching temperature of the film may vary depending on, for example, the desired in-plane retardation value and the desired thickness of the retardation layer, the kind of the resin to be used, the thickness of the film to be used, and the stretching ratio. Specifically, the stretching temperature is preferably from 125° C. to 150° C., more preferably from 130° C. to 140° C., most preferably from 130° C. to 135° C. When the film is stretched at such temperature, a retardation layer having an in-plane retardation with which the effects of the present invention can be appropriately exhibited can be obtained.

Any appropriate stretching method may be adopted as a method of stretching the film. Specifically, one kind of various stretching methods, such as free-end stretching, fixed-end stretching, free-end shrinkage, and fixed-end shrinkage, may be employed alone, or two or more kinds thereof may be employed simultaneously or sequentially. With regard to the stretching direction, the stretching may be performed in various directions or dimensions, such as a horizontal direction, a vertical direction, a thickness direction, and a diagonal direction.

In one embodiment, the retardation layer is formed by subjecting the resin film to free-end uniaxial stretching or fixed-end uniaxial stretching. The free-end uniaxial stretching is specifically, for example, a method involving stretching the resin film between rolls having different peripheral speeds while running the film in its lengthwise direction. The fixed-end uniaxial stretching is specifically, for example, a method involving stretching the resin film in its widthwise direction (lateral direction) while running the film in its longitudinal direction.

In another embodiment, the retardation layer is produced by obliquely stretching the elongated resin film in a direction at a predetermined angle relative to its longitudinal direction in a continuous manner. When the oblique stretching is adopted, an elongated stretched film having a predetermined alignment angle relative to the longitudinal direction of the film (i.e., having a slow axis in a direction at a predetermined angle) is obtained. As a result, for example, a roll-to-roll process can be performed at the time of its lamination with the polarizer, and hence a production process can be simplified. The term "roll-to-roll process" refers to a system involving laminating films with their longitudinal directions aligned with each other while conveying the films with rolls.

As a stretching machine to be used for the oblique stretching, for example, there is given a tenter stretching machine capable of applying feeding forces, or tensile forces or take-up forces, having different speeds on left and right sides in a lateral direction and/or a longitudinal direction. Examples of the tenter stretching machine include a lateral uniaxial stretching machine and a simultaneous biaxial stretching machine, and any appropriate stretching machine may be used as long as the elongated resin film can be continuously subjected to the oblique stretching.

A-4. Another Retardation Layer

As described above, another retardation layer (second retardation layer) 60 can function as a λ/2 plate. The in-plane retardation Re(550) of such retardation layer is from 180 nm to 320 nm, more preferably from 200 nm to 290 nm, still more preferably from 230 nm to 280 nm. The another retardation layer 60 typically has a refractive index ellipsoid of nx>ny=nz or nx>ny>nz. The Nz coefficient of the another retardation layer is, for example, from 0.9 to 2, preferably from 1 to 1.5, more preferably from 1 to 1.3.

The thickness of the another retardation layer may be set so that the layer may most appropriately function as a λ/2 plate. In other words, the thickness may be set so that a desired in-plane retardation may be obtained. Specifically, the thickness is preferably from 10 μm to 60 μm, more preferably from 30 μm to 50 μm.

The another retardation layer contains a resin having an absolute value of a photoelastic coefficient of preferably $2.0 \times 10^{-11}$ $m^2/N$ or less, more preferably from $2.0 \times 10^{-13}$ $m^2/N$ to $1.5 \times 10^{-11}$ $m^2/N$, still more preferably from $1.0 \times 10^{-12}$ $m^2/N$ to $1.2 \times 10^{-11}$ $m^2/N$. When the photoelastic coefficient falls within such range, in the case where a shrinkage stress at the time of the heating of the layer occurs, a change in retardation hardly occurs. Therefore, the formation of the retardation layer through the use of a resin having such photoelastic coefficient can satisfactorily prevent the heat unevenness of an organic EL display apparatus to be obtained.

The another retardation layer may show a reverse wavelength dispersion characteristic, i.e., a retardation value increasing with an increase in wavelength of measurement light, may show a positive wavelength dispersion characteristic, i.e., a retardation value decreasing with an increase in wavelength of measurement light, or may show a flat wavelength dispersion characteristic, i.e., a retardation value hardly changing even when the wavelength of measurement light changes. The layer preferably shows a flat wavelength dispersion characteristic. The adoption of a λ/4 plate (retardation layer) having a flat wavelength dispersion characteristic can achieve an excellent antireflection characteristic and an excellent reflection hue in an oblique direction. The retardation layer preferably has a ratio Re(450)/Re(550) of from 0.99 to 1.03, and preferably has a ratio Re(650)/Re(550) of from 0.98 to 1.02. The another retardation layer (second retardation layer) may be preferably formed of a cyclic olefin-based resin. The cyclic olefin-based resin and a method of forming the second retardation layer are as described in the section A-3 for the first retardation layer.

A-5. Barrier Layer

The barrier layer 30 has barrier properties against moisture and a gas (e.g., oxygen). The water vapor transmittance (moisture permeability) of the barrier layer under the conditions of 40° C. and 90% RH is preferably 0.2 g/m$^2$/24 hr or less, more preferably 0.1 g/m$^2$/24 hr or less, still more preferably 0.05 g/m$^2$/24 hr or less. Meanwhile, a lower limit for the moisture permeability is, for example, 0.001 g/m$^2$/24 hr, preferably 0.005 g/m$^2$/24 hr. The gas barrier property of the barrier layer under the conditions of 60° C. and 90% RH is preferably from $1.0 \times 10^{-7}$ g/m$^2$/24 hr to 0.5 g/m$^2$/24 hr, more preferably from $1.0 \times 10^{-7}$ g/m$^2$/24 hr to 0.1 g/m$^2$/24 hr. When the moisture permeability and the gas barrier property fall within such ranges, in the case where the circularly polarizing plate is bonded to an organic EL panel, the organic EL panel can be satisfactorily protected from moisture and oxygen in air. In addition, the total light transmittance of the gas barrier layer is preferably 70% or more, more preferably 75% or more, still more preferably 80% or more in terms of optical characteristics.

Any appropriate construction may be adopted for the barrier layer 30 as long as the construction has the desired characteristics. In one embodiment, the barrier layer 30 includes a laminated structure of an inorganic thin film and an anchor coat layer. In this case, the barrier layer 30 may be formed on the retardation layer so that the inorganic thin film may be positioned on an organic EL panel side (side distant from the polarizer). In another embodiment, the inorganic thin film may be directly formed on the retardation layer.

The inorganic thin film is formed of any appropriate inorganic compound. The inorganic thin film preferably contains at least one kind of inorganic compound selected from the group consisting of an oxide, a nitride, a hydride, and a composite compound thereof. Specifically, the inorganic compound may be not only the oxide, the nitride, or the hydride alone but also a composite compound of the oxide, the nitride, and/or the hydride. When such compound is used, the thin film can be more excellent in transparency. The inorganic compound forming the inorganic thin film may have any appropriate structure. Specifically, the compound may have a perfect crystal structure, or may have an amorphous structure.

Examples of constituent elements for the inorganic compound include carbon (C), silicon (Si), aluminum (Al), magnesium (Mg), calcium (Ca), potassium (K), zinc (Zn), tin (Sn), nickel (Ni), sodium (Na), boron (B), titanium (Ti), lead (Pb), zirconium (Zr), yttrium (Y), hydrocarbons, oxides, carbides, and nitrides thereof, and mixtures thereof. Those elements may be used alone or in combination thereof. Of those, carbon, silicon, and aluminum are preferably used. Specific examples of the inorganic compound include diamond-like carbon (DLC), silicon nitride (SiN$_x$), silicon oxide (SiO$_y$), aluminum oxide (AlO$_z$), and aluminum nitride. A value for the x of the SiN$_x$ is preferably from 0.3 to 2. A value for the y of the SiO$_y$ is preferably from 1.3 to 2.5. A value for the z of the AlO$_z$ is preferably from 0.7 to 2.3. Of those, the silicon oxide or the aluminum oxide is particularly preferred. This is because a high gas barrier property can be stably maintained.

Any appropriate construction may be adopted for the inorganic thin film. Specifically, the inorganic thin film may be formed of a single layer, or may be a laminate of a plurality of layers. When the inorganic thin film is the laminate, the laminate is specifically, for example, a three-layer construction formed of an inorganic oxide layer, an inorganic nitride layer, and an inorganic oxide layer (e.g., an SiO$_y$ layer, an SiN$_x$ layer, and an SiO$_y$ layer).

Any appropriate method may be adopted as a method of forming the inorganic thin film. Specific examples thereof include a vapor deposition method and a coating method. Of those, a vapor deposition method is preferred because a uniform thin film having a high barrier property is obtained. The vapor deposition method includes: a physical vapor deposition method (PVD), such as vacuum deposition, ion plating, or sputtering; and a chemical vapor deposition method (CVD).

The thickness of the inorganic thin film is preferably from 0.1 nm to 5,000 nm, more preferably from 0.5 nm to 1,000 nm, still more preferably from 10 nm to 1,000 nm, particularly preferably from 30 nm to 500 nm, especially preferably from 50 nm to 200 nm. When the thickness falls within such range, an inorganic thin film that has a sufficient barrier property, does not cause cracking or peeling, and is excellent in transparency can be obtained.

Any appropriate material may be adopted as a formation material for the anchor coat layer. Examples of the material include a resin, a hydrocarbon, a metal, a metal oxide, and a metal nitride.

The anchor coat layer is formed of, for example, a resin composition. A resin to be used in the resin composition may be a solvent-based resin or may be an aqueous resin. In addition, the resin may be a thermoplastic resin, may be a thermosetting resin, or may be a photocurable resin. Specific examples of the resin include a polyester-based resin, a urethane-based resin, an acrylic resin, a nitrocellulose-based resin, a silicon-based resin, an alcoholic hydroxy group-containing resin (e.g., a vinyl alcohol-based resin and an ethylene vinyl alcohol-based resin), a vinyl-based modified resin, an isocyanate group-containing resin, a carbodiimide-based resin, an alkoxyl group-containing resin, an epoxy-based resin, an oxazoline group-containing resin, a modified styrene-based resin, a modified silicon-based resin, and an alkyl titanate.

In one embodiment, the resin composition contains a thermosetting resin or a photocurable resin. The thermosetting resin is, for example, a resin that can be cured by the application of thermal energy, and can form a transparent and flat surface after the curing. Typical examples thereof include polycarbonate, polymethyl methacrylate, polyacrylate, a methyl phthalate homopolymer or copolymer, polyethylene terephthalate, polystyrene, diethylene glycol bisallyl carbonate, an acrylonitrile/styrene copolymer, poly(-4-methylpentene-1), a phenol resin, an epoxy resin, a cyanate resin, a maleimide resin, and a polyimide resin, a product obtained by modifying any of the above-mentioned compounds with polyvinyl butyral, an acrylonitrile-butadiene rubber, a polyfunctional acrylate compound, or the like, and a thermosetting resin obtained by modifying any of the above-mentioned compounds with a thermoplastic resin, such as a cross-linked polyethylene resin, a cross-linked polyethylene/epoxy resin, a cross-linked polyethylene/cyanate resin, a polyphenylene ether/epoxy resin, or a polyphenylene ether/cyanate resin. Those resins may be used alone or in combination thereof. Examples of the photocurable resin include: a resin composition formed of an acrylate compound having a radical reactive unsaturated bond; a resin composition formed of an acrylate compound and a mercapto compound having a thiol group; and a resin composition obtained by dissolving an oligomer, such as epoxy acrylate, urethane acrylate, polyester acrylate, or polyether acrylate, in a polyfunctional acrylate monomer. Those resins may be used alone or in combination thereof.

In another embodiment, the resin composition contains at least one kind of resin selected from the group consisting of a polyester-based resin, a urethane-based resin, an acrylic resin, an isocyanate group-containing resin, an oxazoline group-containing resin, a carbodiimide-based resin, an alcoholic hydroxy group-containing resin, and a copolymer of the resins from the viewpoint of a gas barrier property. Of those, a polyester-based resin is preferred.

The polyester-based resin may be obtained by causing a polyvalent carboxylic acid component and a polyhydric alcohol component to react with each other. Examples of the polyvalent carboxylic acid component include terephthalic acid, isophthalic acid, adipic acid, sebacic acid, azelaic acid, o-phthalic acid, diphenylcarboxylic acid, and dimethylphthalic acid, and examples of the polyhydric alcohol component include ethylene glycol, 1,2-propylene glycol, 1,3-propylene glycol, 1,4-butanediol, diethylene glycol, neopentyl glycol, dipropylene glycol, 1,6-hexanediol, and bisphenol A.

With regard to the molecular weight of the resin composition constituting the anchor coat layer, its number-average molecular weight is preferably from 3,000 to 30,000, more preferably from 4,000 to 28,000, still more preferably from 5,000 to 25,000 from the viewpoints of a gas barrier property and adhesiveness.

A silane coupling agent is preferably added to the resin composition forming the anchor coat layer from the viewpoint of an improvement in adhesiveness between layers. Examples of the silane coupling agent include: epoxy group-containing silane coupling agents, such as β-(3,4-epoxycyclohexyl)ethyltrimethoxysilane, γ-glycidoxypropylmethyldiethoxysilane, and γ-glycidoxypropyltrimethoxysilane; amino group-containing silane coupling agents, such as γ-aminopropyltrimethoxysilane, N-β(aminoethyl)γ-aminopropylmethyldiethoxysilane, N-β(aminoethyl)γ-aminopropyltrimethoxysilane, and N-β(aminoethyl)γ-aminopropyltriethoxysilane; and mixtures thereof. Preferred examples of the silane coupling agent include γ-glycidoxypropyltrimethoxysilane and γ-aminopropyltrimethoxysilane from the viewpoint of the adhesiveness between layers. Those silane coupling agents may be used alone or in combination thereof. The silane coupling agent is added at a ratio of preferably from 0.1 mass % to 80 mass %, more preferably from 1 mass % to 50 mass % with respect to the resin composition forming the anchor coat layer from the viewpoint of the adhesiveness.

The resin composition forming the anchor coat layer preferably contains a curing agent, and polyisocyanate is preferably used as the curing agent. Specific examples thereof include: aliphatic polyisocyanates, such as hexamethylene diisocyanate and dicyclohexylmethane diisocyanate; and aromatic polyisocyanates, such as xylene diisocyanate, tolylenediisocyanate, diphenylmethane diisocyanate, polymethylene polyphenylene diisocyanate, tolidine diisocyanate, and naphthalene diisocyanate. A difunctional or higher polyisocyanate is particularly preferred from the viewpoint of an improvement in barrier property.

In the resin composition forming the anchor coat layer, any appropriate additive may be blended as required. Examples of such additive include: polyhydric alcohols, such as glycerin, ethylene glycol, polyethylene glycol, and polypropylene glycol; aqueous epoxy resins; lower alcohols, such as methanol, ethanol, n-propanol, and isopropanol; ethers, such as ethylene glycol monomethyl ether, propylene glycol monomethyl ether, propylene glycol diethyl ether, diethylene glycol monoethyl ether, and propylene glycol monoethyl ether; esters, such as propylene glycol monoacetate and ethylene glycol monoacetate; antioxidants; weathering stabilizers; UV absorbers; antistatic agents; pigments; dyes; antimicrobial agents; lubricants; inorganic fillers; antiblocking agents; adhesives; and plasticizers. In addition, any appropriate resin or additive may be added for the purposes of, for example, improving the film formability of the resin composition and preventing a pinhole.

Preferred examples of the metal forming the anchor coat layer include chromium, aluminum, silicon, nickel, titanium, tin, iron, molybdenum, and alloys of two or more kinds thereof from the viewpoints of the barrier property and the adhesiveness. In addition, as the metal oxide or the metal nitride, oxides and nitrides of the above-mentioned metals are preferred from the viewpoints of the barrier property and the adhesiveness. Of those, chromium, silicon oxide, aluminum oxide, titanium oxide, silicon nitride, aluminum nitride, titanium nitride are preferred, and silicon oxide and silicon nitride are more preferred.

The hydrocarbon forming the anchor coat layer is, for example, diamond-like carbon.

The thickness of the anchor coat layer is preferably from 0.1 nm to 5,000 nm, more preferably from 10 nm to 2,000 nm, still more preferably from 100 nm to 1,000 nm, particularly preferably from 300 nm to 600 nm.

Any appropriate method may be adopted as a method of forming the anchor coat layer. When the resin composition is used, examples of the formation method include coating and immersion. Specific examples of the coating method include a reverse roll coater, a gravure coater, a rod coater, an air doctor coater, a spray, and a brush. A uniform anchor coat layer can be formed by subjecting, after the coating or the immersion, a coated layer or a layer formed by the immersion to any appropriate drying treatment to evaporate a solvent. Examples of the drying treatment include: heat drying, such as hot-air drying or drying with a heated roll; and infrared drying. A heating temperature is, for example, from about 80° C. to about 200° C. The formed anchor coat layer may be subjected to cross-linking treatment based on irradiation with an energy ray in order that its water resistance and durability may be improved.

When the metal, the metal oxide, or the metal nitride is used, examples of the formation method include a vapor deposition method and a coating method. Of those, a vapor deposition method is preferred because a uniform thin film having high adhesiveness is obtained. Typical examples of the vapor deposition method include: a physical vapor deposition method (PVD), such as vacuum deposition, ion plating, or sputtering; and a chemical vapor deposition method (CVD).

In order to improve the applicability and adhesive property of the anchor coat layer formation material to the surface on which the anchor coat layer is formed (in the present invention, the surface of the retardation layer), the surface may be subjected to any appropriate surface treatment (e.g., chemical treatment or discharge treatment) before the application. In addition, the anchor coat layer may be subjected to such surface treatment before the formation of the barrier layer.

A protective layer may be formed on the surface side (inorganic thin film side or pressure-sensitive adhesive layer side) of the barrier layer. The protective layer is typically formed of a resin. The resin forming the protective layer may be a solvent-based resin or may be an aqueous resin. Specific examples thereof include a polyester-based resin, a urethane-based resin, an acrylic resin, a polyvinyl alcohol-based resin, an ethylene-unsaturated carboxylic acid copolymer, an ethylene vinyl alcohol-based resin, a vinyl-modified resin, a nitrocellulose-based resin, a silicon-based resin, an isocyanate-based resin, an epoxy-based resin, an oxazoline group-containing resin, a modified styrene-based resin, a modified silicon-based resin, and an alkyl titanate. Those resins may be used alone or in combination thereof. Inorganic particles may be added to the protective layer for improving its barrier property, abrasion resistance, and sliding property. Examples of the inorganic particles include a silica sol, an alumina sol, a particulate inorganic filler, and a layered inorganic filler. Those particles may be used alone or in combination thereof. The inorganic particles may be added by mixing, or may be added by polymerizing a monomer of the resin in the presence of the inorganic particles.

The resin forming the protective layer is preferably an aqueous resin in terms of an improvement in gas barrier property of the inorganic thin film, and is more preferably a vinyl alcohol resin or an ethylene vinyl alcohol resin. A blend of polyvinyl alcohol and an ethylene-unsaturated carboxylic acid copolymer is also suitable.

A method of forming the protective layer is the same as the method of forming the anchor coat layer involving using the resin composition described above. The thickness of the protective layer is preferably from 0.05 μm to 10 μm, more preferably from 0.1 μm to 3 μm.

The barrier layer 30 may be a single layer or may include a plurality of layers. The term "one barrier layer" as used herein means that the number of constituent unit layers each formed of the anchor coat layer and the inorganic thin film, and as required, the protective layer is one. In the case where the barrier layer includes a plurality of layers, the number of the constituent unit layers is preferably from 1 to 10, more preferably from 1 to 5. In this case, the respective constituent unit layers may be identical to or different from each other.

A-6. Pressure-Sensitive Adhesive Layer

As described above, the pressure-sensitive adhesive layer 40 has the barrier function. In the case where the barrier function is imparted to the pressure-sensitive adhesive layer of the circularly polarizing plate, a circularly polarizing plate having an excellent organic EL panel-protecting function can be obtained by a synergistic effect with the barrier layer. Further, an organic EL display apparatus can be produced with production efficiency more excellent than that in the case where the barrier layer is formed on an organic EL panel. A pressure-sensitive adhesive having the barrier function is, for example, a rubber-based pressure-sensitive adhesive composition using a rubber-based polymer as a base polymer.

Examples of the rubber-based polymer include: a conjugated diene-based polymer obtained by polymerizing one kind of conjugated diene compound, a conjugated diene-based copolymer obtained by polymerizing two or more kinds of conjugated diene compounds, and a conjugated diene-based copolymer obtained by copolymerizing a conjugated diene compound and an aromatic vinyl compound; and hydrogenated products thereof.

The conjugated diene compound is not particularly limited as long as the compound is a monomer having a polymerizable conjugated diene. Specific examples of the conjugated diene compound include 1,3-butadiene, isoprene, 2,3-dimethyl-1,3-butadiene, 1,3-pentadiene, 3-methyl-1,3-pentadiene, 1,3-heptadiene, and 1,3-hexadiene. Of those, 1,3-butadiene and isoprene are preferred from the viewpoint of the ease of industrial availability. The conjugated diene compounds may be used alone or in combination thereof.

The aromatic vinyl compound is not particularly limited as long as the compound is a monomer having an aromatic vinyl structure copolymerizable with the conjugated diene compound. Specific examples of the aromatic vinyl compound include styrene, p-methylstyrene, α-methylstyrene, vinylethylbenzene, vinylxylene, vinylnaphthalene, and diphenylethylene. Of those, styrene is preferred from the viewpoint of the ease of industrial availability. The aromatic vinyl compounds may be used alone or in combination thereof.

The diene-based copolymers may be random copolymers or may be block copolymers. In addition, a diene-based copolymer may be obtained by copolymerizing a compound except the conjugated diene compound and the aromatic vinyl compound.

The conjugated diene-based copolymer obtained by copolymerizing the conjugated diene compound and the aromatic vinyl compound preferably has a molar ratio "conjugated diene compound/aromatic vinyl compound" of the conjugated diene compound to the aromatic vinyl compound of from 10/90 to 90/10 (mol %).

Specific examples of such conjugated diene-based (co) polymer include a butadiene rubber (BR), an isoprene rubber (IR), a styrene-butadiene copolymer (SBR), a butadiene-isoprene-styrene random copolymer, an isoprene-styrene random copolymer, a styrene-isoprene block copolymer (SIS), a butadiene-styrene copolymer, a styrene-ethylene-butadiene block copolymer (SEBS), and an acrylonitrile-butadiene rubber (NBR). The (co) polymers may be used alone or in combination thereof. Of those, an isoprene-styrene copolymer is preferred. In addition, hydrogenated products thereof may be suitably used.

As the rubber-based polymer except the conjugated diene-based (co)polymer, for example, isobutylene (IB), a styrene-isobutylene-styrene block copolymer (SIBS), or a styrene-ethylene propylene copolymer-styrene block copolymer may be used. The rubber-based polymers may be used alone or in combination thereof.

The rubber-based polymer that may be used in the present invention contains the conjugated diene-based (co)polymer at preferably 50 wt % or more, more preferably 70 wt % or more, still more preferably 80 wt % or more, particularly preferably 90 wt % or more in the entirety of the rubber-based polymer. An upper limit for the content of the conjugated diene-based (co)polymer is not particularly limited, and the content may be 100 wt % (i.e., the rubber-based polymer may be formed only of the conjugated diene-based (co)polymer).

As described above, the pressure-sensitive adhesive composition contains the rubber-based polymer as the base polymer. The content of the rubber-based polymer in the pressure-sensitive adhesive composition is preferably 40 wt % or more, more preferably 50 wt % or more, still more preferably 60 wt % or more. An upper limit for the content of the rubber-based polymer is not particularly limited, and the content is, for example, 90 wt % or less.

The pressure-sensitive adhesive composition may further contain any appropriate additive in addition to the rubber-based polymer. Specific examples of the additive include cross-linking agents (e.g., polyisocyanate, an epoxy compound, and an alkyl etherified melamine compound), tackifiers (e.g., a rosin derivative resin, a polyterpene resin, a petroleum resin, an oil-soluble phenol resin, and a vinyltoluene resin), plasticizers, fillers (e.g., a layered silicate and a clay material), and age inhibitors. The kinds, combination, addition amounts, and the like of the additives to be added to the pressure-sensitive adhesive composition may be appropriately set in accordance with purposes. The content (total amount) of the additives in the pressure-sensitive adhesive composition is preferably 60 wt % or less, more preferably 50 wt % or less, still more preferably 40 wt % or less.

The thickness of the pressure-sensitive adhesive layer 40 is, for example, from about 1 μm to about 300 μm, preferably from 1 μm to 200 μm, more preferably from 2 μm to 100 μm, still more preferably from 25 μm to 100 μm.

As described above, the pressure-sensitive adhesive layer 40 has a barrier property, and typically has barrier properties against moisture and a gas (e.g., oxygen). The water vapor transmittance (moisture permeability) of the pressure-sensitive adhesive layer under the conditions of 40° C. and 90% RH when the thickness of the layer is 100 μm is preferably 200 g/m$^2$/24 hr or less, more preferably 150 g/m$^2$/24 hr or less, still more preferably 100 g/m$^2$/24 hr or less, particularly preferably 70 g/m$^2$/24 hr or less. A lower limit for the moisture permeability is, for example, g/m$^2$/24 hr, preferably 15 g/m$^2$/24 hr. When the moisture permeability of the pressure-sensitive adhesive layer falls within such range, in the case where the circularly polarizing plate is bonded to an organic EL panel, the organic EL panel can be satisfactorily protected from moisture and oxygen in air by a synergistic effect with the barrier properties of the barrier layer.

A peeling film is preferably bonded to the surface of the pressure-sensitive adhesive layer until the layer is used.

A-7. Protective Film

The protective film 50 is formed of any appropriate film that may be used as a protective layer for the polarizer. Specific examples of a material serving as a main component of the film include transparent resins, for example, a cellulose-based resin, such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth) acrylic resin, and an acetate-based resin. Another example thereof is a thermosetting resin or a UV-curable resin, such as a (meth)acrylic resin, a urethane-based resin, a (meth) acrylic urethane-based resin, an epoxy-based resin, or a silicone-based resin. Still another example thereof is a glassy polymer, such as a siloxane-based polymer. In addition, a polymer film disclosed in JP 2001-343529 A (WO 01/37007 A1) may also be used. As a material for the film, for example, there may be used a resin composition containing a thermoplastic resin having a substituted or unsubstituted imide group in a side chain and a thermoplastic resin having a substituted or unsubstituted phenyl group and a nitrile group in a side chain. An example thereof is a resin composition containing an alternate copolymer formed of isobutene and N-methylmaleimide and an acrylonitrile-styrene copolymer. The polymer film may be, for example, a product obtained by subjecting the resin composition to extrusion molding.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit for the Tg of the (meth)acrylic resin is not particularly limited, but is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates, such as polymethyl methacrylate, a methyl methacrylate-(meth)acrylic acid copolymer, a methyl methacrylate-(meth)acrylate copolymer, a methyl methacrylate-acrylate-(meth)acrylic acid copolymer, a methyl (meth)acrylate-styrene copolymer (e.g., an MS resin), and a polymer having an alicyclic hydrocarbon group (e.g., a methyl metharylate-cyclohexyl methacrylate copolymer or a methyl methacrylate-norbornyl (meth)acrylate copolymer). Preferred examples thereof include poly(C$_{1-6}$ alkyl (meth)acrylates), such as polymethyl (meth)acrylate. A more preferred example thereof is a methyl methacrylate-based resin containing methyl methacrylate as a main component (from 50 wt % to 100 wt %, preferably from 70 wt % to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule disclosed in JP 2004-70296 A, and a (meth)acrylic resin with a high Tg obtained by intramolecular cross-linking or an intramolecular cyclization reaction.

The (meth)acrylic resin is particularly preferably a (meth) acrylic resin having a lactone ring structure because of having high heat resistance, high transparency, and high mechanical strength.

Examples of the (meth)acrylic resin having a lactone ring structure include (meth)acrylic resins each having a lactone ring structure disclosed in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more because excellent durability can be obtained. An upper limit value for the Tg of the (meth)acrylic resin having a lactone ring structure is not particularly limited, but is preferably 170° C. or less from the viewpoint of formability or the like.

The term "(meth)acrylic" as used herein refers to acrylic and/or methacrylic.

The protective film 40 may be subjected to surface treatment, such as hard coat treatment, antireflection treatment, sticking prevention treatment, or antiglare treatment, as required. The thickness of the protective film is typically 5 mm or less, preferably 1 mm or less, more preferably from 1 μm to 500 μm, still more preferably from 5 μm to 150 μm.

When the inner protective film is adopted, it is preferred that the inner protective film be optically isotropic. The phrase "optically isotropic" as used herein means that the in-plane retardation Re(550) of the film is from 0 nm to 10 nm and the thickness direction retardation Rth(550) thereof is from −10 nm to +10 nm. The Re(550) of the inner protective film is preferably from 0 nm to 8 nm, more preferably from 0 nm to 6 nm, still more preferably from 0 nm to 3 nm. The Rth(550) of the inner protective film is preferably from −8 nm to +8 nm, more preferably from −6 nm to +6 nm, still more preferably from −3 nm to +3 nm. When the inner protective film is optically isotropic, the viewing angle of a display apparatus can be further enlarged and the color shift thereof can be further reduced.

A-8. Method of Producing Circularly Polarizing Plate

A typical embodiment of a method of producing the circularly polarizing plate of the present invention is described below. This embodiment is a system involving continuously laminating the polarizer and the retardation layer by the roll-to-roll process, and the circularly polarizing plate can be produced by the system with extremely excellent production efficiency.

First, a retardation film constituting the retardation layer 20 is prepared. The retardation film is elongated and has a slow axis in a direction at a predetermined angle relative to its longitudinal direction. The material, characteristics, production method, and the like of such retardation film are as described in the section A-3.

Next, a reinforcing film is bonded to one surface of the retardation film through intermediation of a pressure-sensitive adhesive by the roll-to-roll process. Thus, a laminate of the retardation film and the reinforcing film is obtained. The reinforcing film having applied thereto the pressure-sensitive adhesive and the retardation film are typically bonded to each other by the roll-to-roll process.

Any appropriate material may be adopted as a material for the reinforcing film. Examples thereof include a plastic, paper, a metal film, and a nonwoven fabric. Of those, a plastic is preferred. The reinforcing film may include one kind of material, or may include two or more kinds of materials. For example, the film may include two or more kinds of plastics.

Examples of the plastic include a polyester-based resin, a polyamide-based resin, and a polyolefin-based resin. Examples of the polyester-based resin include polyethylene terephthalate, polybutylene terephthalate, and polyethylene naphthalate. Examples of the polyolefin-based resin include a homopolymer of an olefin monomer and a copolymer of an olefin monomer. Specific examples of the polyolefin-based resin include: homopolypropylenes; propylene-based copolymers, such as a block, random, or graft propylene-based copolymer having an ethylene component as a copolymerization component; Reactor-TPO; ethylene-based polymers of low density, high density, linear low density, or ultra low density; and ethylene-based copolymers, such as an ethylene-propylene copolymer, an ethylene-vinyl acetate copolymer, an ethylene-methyl acrylate copolymer, an ethylene-ethyl acrylate copolymer, an ethylene-butyl acrylate copolymer, an ethylene-methacrylic acid copolymer, and an ethylene-methyl methacrylate copolymer. Of those, a polyester-based resin is preferred and polyethylene terephthalate is more preferred. Such resin has high dimensional stability, high stiffness, and high heat resistance, and has an advantage in that the resin is excellent in general-purpose property from the viewpoint that the resin can be a subsidiary material.

The reinforcing film may contain any appropriate additive as required. Examples of the additive include an antioxidant, a UV absorber, a light stabilizer, an antistatic agent, a filler, and a pigment. The kinds, number, and amounts of the additives may be appropriately set in accordance with purposes. In particular, when the material for the reinforcing film is the plastic, two or more kinds of the additives are preferably incorporated for the purpose of, for example, preventing the deterioration of the film.

Any appropriate antioxidant may be adopted as the antioxidant. Examples of such antioxidant include a phenol-based antioxidant, a phosphorus-based processing heat stabilizer, a lactone-based processing heat stabilizer, a sulfur-based heat stabilizer, and a phenol-phosphorus-based antioxidant. The content of the antioxidant is preferably 1 part by weight or less, more preferably 0.5 part by weight or less, still more preferably from 0.01 part by weight to 0.2 part by weight with respect to 100 parts by weight of the base resin of the reinforcing film (when the reinforcing film is a blend, the blend is the base resin).

Any appropriate UV absorber may be adopted as the UV absorber. Examples of such UV absorber include a benzotriazole-based UV absorber, a triazine-based UV absorber, and a benzophenone-based UV absorber. The content of the UV absorber is preferably 2 parts by weight or less, more preferably 1 part by weight or less, still more preferably from 0.01 part by weight to 0.5 part by weight with respect to 100 parts by weight of the base resin of the reinforcing film.

Any appropriate light stabilizer may be adopted as the light stabilizer. Examples of such light stabilizer include a hindered amine-based light stabilizer and a benzoate-based light stabilizer. The content of the light stabilizer is preferably 2 parts by weight or less, more preferably 1 part by weight or less, still more preferably from 0.01 part by weight to 0.5 part by weight with respect to 100 parts by weight of the base resin of the reinforcing film.

Any appropriate filler may be adopted as the filler. Such filler is, for example, an inorganic filler. Specific examples of the inorganic filler include carbon black, titanium oxide, and zinc oxide. The content of the filler is preferably 20 parts by weight or less, more preferably 10 parts by weight or less, still more preferably from 0.01 part by weight to 10 parts by weight with respect to 100 parts by weight of the base resin forming the reinforcing film (when the reinforcing film is a blend, the blend is the base resin).

Further, preferred examples of the additive include inorganic, low-molecular weight-type, and high-molecular weight-type antistatic agents intended to impart antistatic properties, such as a surfactant, an inorganic salt, a polyhydric alcohol, a metal compound, and carbon. Of those, a high-molecular weight-type antistatic agent or carbon is particularly preferred from the viewpoints of the prevention of the contamination of the film and the maintenance of the pressure-sensitive adhesive property thereof.

Any appropriate thickness may be adopted as the thickness of the reinforcing film. The thickness of the reinforcing film is preferably from 5 μm to 300 μm, more preferably from 10 μm to 250 μm, still more preferably from 15 μm to 200 μm, particularly preferably from 20 μm to 150 μm. Further, the total thickness of the reinforcing film and the pressure-sensitive adhesive to be described later is preferably from 1 time to 4 times as large as the thickness of the retardation film.

The reinforcing film may be a single layer, or may be a laminate of two or more layers.

The product (GPa·μm) of the tensile modulus of elasticity (GPa) at 23° C. and thickness (μm) of the reinforcing film is preferably from 20 to 500, more preferably from 30 to 300. The value may be controlled by adjusting the kinds and amounts of the formation material and additive of the reinforcing film, and when the reinforcing film is a laminate, a ratio between the thicknesses of the respective layers. When the product is less than 20 (GPa·μm), the tensility of the reinforcing film is insufficient and hence a wrinkle occurs at the time of its lamination with the retardation film to impair the appearance of the circularly polarizing plate in some cases. When the product is more than 500 (GPa·μm), the tensility of the reinforcing film is so strong that a handling property at the time of its peeling from the retardation film becomes insufficient in some cases.

The linear expansion coefficient of the reinforcing film is preferably as small as possible. The linear expansion coefficient is preferably from 5 ppm/° C. to 50 ppm/° C., more preferably from 10 ppm/° C. to 30 ppm/° C. The ratio at which the dimensions of the reinforcing film are changed by heating is also preferably as small as possible. For example, a dimensional change ratio after heating at 180° C. for 5 minutes is preferably from 0.1% to 5.0%, more preferably from 0.5% to 3.0%. When a reinforcing film having a small linear expansion coefficient and/or a small dimensional change ratio by heating is used, even under a high-temperature environment in a barrier layer-forming process, the dimensional change of the retardation film can be suppressed and hence a change in orientation of a molecule in the film can be alleviated. As a result, the optical characteristics (e.g., a slow axis direction and a retardation value) of the retardation film can be satisfactorily maintained.

In one embodiment, the reinforcing film is stretched. Stretching conditions may vary depending on purposes, a desired linear expansion coefficient, and the like. A stretching ratio is preferably from 1.5 times to 10 times, more preferably from 3.0 times to 5.0 times. A stretching temperature is preferably from the glass transition temperature (Tg) of the reinforcing film to a temperature higher than the Tg by 50° C. (Tg+50° C.). The stretching is preferably biaxial stretching. This is because the anisotropy of each of thermal properties and mechanical properties in the surface of the film can be alleviated. A method for the biaxial stretching may be any one of a tenter simultaneous biaxial stretching method, and a sequential biaxial stretching method based on a roll and a tenter. A tubular method may also be used.

When such retardation film as described in the section A-3 and such reinforcing film as described above are used, in the case where the laminate of the retardation film and the reinforcing film is subjected to a vapor deposition method (e.g., sputtering) for the formation of the barrier layer, the following advantage is obtained. That is, a retardation film obtained by oblique stretching originally tends to have a large variation in orientation (slow axis direction), and a problem in that the variation in orientation (slow axis direction) becomes larger owing to a thermal stimulus and/or a mechanical stimulus may occur. Further, when the laminate is placed under a high-temperature environment in the vapor deposition method, the films may break or deform. When such retardation film and reinforcing film as described above are used in combination, even in the case where the laminate is placed under such high-temperature environment as used in the vapor deposition method, the optical characteristics and mechanical characteristics of the retardation film can be maintained within allowable ranges. Therefore, the barrier layer can be formed on the surface of the retardation film obtained by the oblique stretching while the characteristics of the film are maintained. As a result, the retardation film having formed thereon the barrier layer can be subjected to the roll-to-roll process.

Any appropriate pressure-sensitive adhesive may be used as the pressure-sensitive adhesive for the reinforcing film. Specific examples of the base polymer of the pressure-sensitive adhesive include a (meth)acrylic polymer, a rubber-based polymer, a silicone-based polymer, a polyurethane-based polymer, and a polyester-based polymer. The pressure-sensitive adhesive preferably contains a (meth)acrylic polymer having, as a main component (monomer unit), a (meth)acrylic acid alkyl ester having an alkyl group having 1 to 20 carbon atoms. The term "main component" means a monomer having the highest constituent ratio out of the monomer units (components) constituting the (meth)acrylic polymer. Details about such pressure-sensitive adhesive are disclosed in, for example, JP 2014-141649 A, and the corresponding disclosure is incorporated herein by reference.

Next, the barrier layer is formed on the surface of the retardation film of the laminate of the retardation film and the reinforcing film. In more detail, the anchor coat layer is formed on the surface of the retardation film, and the inorganic thin film is formed on the surface of the anchor coat layer. The protective layer is formed on the surface of the inorganic thin film as required. The materials, formation methods, and the like of the anchor coat layer, the inorganic thin film, and the protective layer are as described in the section A-5.

Heat treatment may be performed after the formation of the anchor coat layer, after the formation of the inorganic thin film, and/or after the formation of the protective layer. When the heat treatment is performed, the barrier properties and film quality of the barrier layer to be obtained can be stabilized. In addition, air bubbles can be finely dispersed in the barrier layer to be obtained, and hence an adverse effect caused by the air bubbles can be prevented. Any appropriate method may be adopted as a heating method in the heat treatment. Specific examples thereof include: a method involving storing the resultant laminate in an oven or a thermostatic chamber set to a predetermined temperature; a method involving blowing hot air against the laminate; a method involving heating the laminate with an infrared heater; a method involving irradiating the laminate with light through the use of a lamp; a method involving bringing the laminate into contact with a heated roll or a hot plate to directly apply heat thereto; and a method involving irradiating the laminate with a microwave. The heat treatment can be performed in a production process for the barrier layer by incorporating a heating apparatus into part of a film-producing apparatus, such as a coater or a slitter.

Any appropriate conditions may be adopted as conditions for the heat treatment in accordance with, for example, the structure, formation material, and thickness of the barrier layer. A heat treatment temperature is typically a temperature equal to or less than the melting point of the retardation film, and is preferably a temperature that does not adversely affect the optical characteristics and mechanical characteristics of the retardation film. Specifically, the heat treatment temperature is preferably 60° C. or more, more preferably 70° C. or more because a treatment time necessary for the expression of the effect of the heat treatment can be moderately set. Meanwhile, an upper limit for the heat treatment temperature is, for example, 200° C., preferably 160° C. from the viewpoint of the prevention of reductions in barrier properties of the barrier layer. A heat treatment time may depend on the heat treatment temperature. For example, when the heat treatment temperature is 150° C., the heat treatment time may be from about 3 minutes to about 60 minutes.

Thus, an optical laminate (intermediate for a circularly polarizing plate) having a construction "barrier layer/retardation film/reinforcing film" is produced. As is apparent from the foregoing description, the optical laminate in this embodiment is elongated (roll shape in the described example). As described above, when a specific retardation film and a specific reinforcing film are used in combination, the barrier layer can be formed on the surface of the retardation film obtained by the oblique stretching while the optical characteristics and mechanical characteristics of the film are maintained. Therefore, the retardation film having formed thereon the barrier layer can be subjected to the roll-to-roll process. That is, the optical laminate thus obtained is one result actually obtained in the present invention, and is one means for achieving the circularly polarizing plate of the present invention and an excellent effect thereof.

Next, the reinforcing film is peeled from the optical laminate, and the polarizer is bonded to the peeled surface by the roll-to-roll process. In one embodiment, the laminate of the barrier layer and the retardation film obtained by peeling the reinforcing film, and a polarizing plate (laminate of the polarizer and the protective film) are bonded to each other by the roll-to-roll process so that the polarizer may be adjacent to the retardation film. In another embodiment, the laminate of the barrier layer and the retardation film, the polarizer, and the protective film are collectively bonded to each other by the roll-to-roll process. In still another embodiment, the laminate of the barrier layer and the retardation film, and the polarizer are bonded to each other by the roll-to-roll process, and then the protective film is bonded to the resultant by the roll-to-roll process. The polarizing plate or the polarizer is elongated (roll shape in the described example), and has an absorption axis in its longitudinal direction. In the embodiment of the present invention, as described above, the barrier layer can be formed on the retardation film having the slow axis in an oblique direction (direction at a predetermined angle relative to its longitudinal direction), and hence lamination by the roll-to-roll process can be performed by using a polarizer obtained by typical longitudinal uniaxial stretching.

Finally, the pressure-sensitive adhesive layer is formed on the surface of the barrier layer. The pressure-sensitive adhesive constituting the pressure-sensitive adhesive layer is as described in the section A-6.

Thus, the circularly polarizing plate of the present invention is obtained.

The case where the retardation layer 20 is used alone has been described as a typical example of the method of producing the circularly polarizing plate based on the roll-to-roll process. However, it is obvious to a person skilled in the art that the same procedure is applicable to the case where the first retardation layer 20 and the second retardation layer 60 are used in combination. Specifically, a laminate of the retardation film constituting the first retardation layer 20 and a retardation film constituting the second retardation layer 60 only needs to be used instead of the retardation film constituting the retardation layer 20.

The circularly polarizing plate of the present invention may be produced by a so-called batch system. That is, the retardation film having formed thereon the barrier layer and the polarizing plate (laminate of the polarizer and the protective film) may be bonded to each other after having been cut into predetermined sizes. Alternatively, the retardation film having formed thereon the barrier layer, the polarizer, and the protective film may be bonded to each other after having been cut into respective predetermined sizes. The batch system eliminates the need for the control of the angle between the absorption axis of the polarizer and the slow axis of the retardation film in a roll state, and hence a retardation film obtained by longitudinal stretching or lateral stretching can be used.

B. Organic EL Display Apparatus

An organic EL display apparatus of the present invention includes the circularly polarizing plate described in the section A on its viewer side. The circularly polarizing plate is laminated so that the pressure-sensitive adhesive layer may be positioned on an organic EL panel side (the polarizer may be positioned on the viewer side).

EXAMPLES

The present invention is specifically described below byway of Examples. However, the present invention is not limited by these Examples. Methods of measuring the respective characteristics are as described below.

(1) Heat Resistance

Circularly polarizing plates obtained in Examples and Comparative Examples were each cut into a size measuring 50 mm by 50 mm to be used as a measurement sample. The measurement sample was bonded to a quartz glass, and the resultant was stored in an oven at 95° C. for 500 hours, followed by the measurement of a variation in hue value after the storage with respect to its hue value before the storage. The hue value was measured with "DOT-3" manufactured by Murakami Color Research Laboratory Co., Ltd.

(2) Moisture Permeability

The circularly polarizing plates obtained in Examples and Comparative Examples were each cut into a circular shape having a diameter of 10 cm to be used as a measurement sample. The moisture permeability of the measurement sample was measured with "DELTAPERM" manufactured by Technolox under the test conditions of 40° C. and 90% RH. The moisture permeability of the circularly polarizing plate of Comparative Example 2 was measured with "PERMTRAN" manufactured by MOCON, Inc. under the test conditions of 40° C. and 90% RH because the moisture permeability exceeded the measurement upper limit value of the former apparatus.

Example 1

A commercial polyvinyl alcohol (PVA) film ("VF-PS" manufactured by Kuraray Co., Ltd.) was dyed in an aqueous solution containing iodine, and was then uniaxially stretched at about 6 times in an aqueous solution containing boric acid between rolls having different speed ratios to provide an elongated polarizer (thickness: 30 μm). A ratio K/I between an iodine concentration (wt %) and a potassium concentration (wt %) in the polarizer was 0.402. A commercial TAC film ("TD80UL" manufactured by Fuji Photo Film Co., Ltd., thickness: 80 μm) was bonded as a protective film to one surface of the polarizer with a PVA-based adhesive. Thus, a polarizing plate having a construction "polarizer/protective film" was obtained. The polarizing plate was punched into a size measuring 20 cm long by 30 cm wide. At this time, the punching was performed so that the absorption axis of the polarizer served as a longitudinal direction.

Meanwhile, a commercial elongated norbornene-based resin film ("ZEONOR" manufactured by Zeon Corporation, thickness: 50 μm) was stretched at 1.52 times to provide a retardation film (thickness: 35 μm) having an Re(550) of 140 nm. A barrier layer (thickness: 150 nm) was formed on the retardation film. Thus, a laminate of the barrier layer and the retardation layer was obtained. An $SiO_x$ film was formed as the barrier layer by a sputtering method involving using an SiO target. The moisture permeability of the barrier layer was 0.05 $g/m^2/24$ hr.

The polarizing plate, and the laminate of the barrier layer and the retardation layer obtained in the foregoing were bonded to each other through intermediation of an acrylic pressure-sensitive adhesive so that the polarizer and the retardation layer were adjacent to each other. At this time, the bonding was performed so that the slow axis of the retardation layer was positioned at 45° in a counterclockwise direction relative to the absorption axis of the polarizer.

Finally, a pressure-sensitive adhesive layer (thickness: 50 μm) having a barrier function was formed on the surface of the barrier layer. Thus, a circularly polarizing plate having a construction "protective film/polarizer/retardation layer (λ/4 plate)/barrier layer/pressure-sensitive adhesive layer" was obtained. A pressure-sensitive adhesive produced as follows was used as a pressure-sensitive adhesive constituting the pressure-sensitive adhesive layer: 100 parts by weight of a styrene-ethylene-propylene copolymer-styrene block copolymer (manufactured by Kuraray Co., Ltd., trade name: "SEPTON 2063", styrene content: 13 wt %) was compounded with 10 parts by weight of polybutene (manufactured by JX Nippon Oil & Energy Corporation, trade name: "NISSEKI POLYBUTENE HV-300"), 40 parts by weight of a terpene phenol tackifier (manufactured by Yasuhara Chemical Co., Ltd., trade name: "YS POLYSTER TH130"), and an aromatic tackifier (manufactured by Eastman Chemical Company, trade name: "PICCOLASTIC A5"). The moisture permeability of the pressure-sensitive adhesive layer was 10 $g/m^2/24$ hr (in terms of 50 μm). The resultant circularly polarizing plate was subjected to the evaluations (1) and (2). The results are shown in Table 1.

Example 2

A commercial elongated norbornene-based resin film ("ZEONOR" manufactured by Zeon Corporation, thickness: 75 μm) was stretched at 2.55 times to provide a retardation film (thickness: 45 μm) having an Re(550) of 270 nm. The retardation film (second retardation layer) and the retardation film (first retardation layer) obtained in Example 1 were laminated, and then a barrier layer was formed on the surface of the first retardation layer in the same manner as in Example 1. Thus, a laminate of the barrier layer, the first retardation layer, and the second retardation layer was obtained. A circularly polarizing plate having a construction "protective film/polarizer/second retardation layer (λ/2 plate)/first retardation layer (λ/4 plate)/barrier layer/pressure-sensitive adhesive layer" was obtained in the same manner as in Example 1 except that the laminate was used. The resultant circularly polarizing plate was subjected to the evaluations (1) and (2). The results are shown in Table 1.

Example 3

A circularly polarizing plate having a construction "protective film/polarizer/second retardation layer (λ/2 plate)/first retardation layer (λ/4 plate)/barrier layer/pressure-sensitive adhesive layer" was obtained in the same manner as in Example 2 except that a polarizer having a ratio K/I of 0.210 was used. The resultant circularly polarizing plate was subjected to the evaluations (1) and (2). The results are shown in Table 1.

Comparative Example 1

A circularly polarizing plate having a construction "protective film/polarizer/second retardation layer (λ/2 plate)/first retardation layer (λ/4 plate)/pressure-sensitive adhesive layer" was obtained in the same manner as in Example 2 except that: the barrier layer was not formed; and a typical acrylic pressure-sensitive adhesive layer was formed. The resultant circularly polarizing plate was subjected to the evaluations (1) and (2). The results are shown in Table 1.

Comparative Example 2

A circularly polarizing plate having a construction "protective film/polarizer/second retardation layer (λ/2 plate)/first retardation layer (λ/4 plate)/pressure-sensitive adhesive layer" was obtained in the same manner as in Example 2 except that the barrier layer was not formed. The resultant circularly polarizing plate was subjected to the evaluations (1) and (2). The results are shown in Table 1.

TABLE 1

|  | Heat resistance (variation in a value) | Moisture permeability ($g/m^2/24$ hr) |
|---|---|---|
| Example 1 | 7 | $8.5 \times 10^{-3}$ |
| Example 2 | 7 | $8.0 \times 10^{-3}$ |
| Example 3 | 4 | $1.0 \times 10^{-2}$ |
| Comparative Example 1 | 3 | 20 |
| Comparative Example 2 | 3 | 15 |

As is apparent from Table 1, the circularly polarizing plates of Examples of the present invention are each extremely excellent in barrier property (moisture permeability). Further, as is apparent from comparison between Example 2 and Example 3, a polarizing plate satisfying an excellent moisture permeability and excellent heat resistance at the same time is obtained by improving the heat resistance of a polarizer through the adjustment of a ratio K/I.

INDUSTRIAL APPLICABILITY

The circularly polarizing plate of the present invention is suitably used in an organic EL display apparatus.

REFERENCE SIGNS LIST

10 polarizer
20 retardation layer
30 barrier layer
40 pressure-sensitive adhesive layer
50 protective film
60 another retardation layer
100 circularly polarizing plate
101 circularly polarizing plate

The invention claimed is:
1. A circularly polarizing plate for an organic EL display apparatus, comprising in this order:
a polarizer;
a retardation layer functioning as a λ/4 plate;
another retardation layer functioning as a λ/2 plate between the polarizer and the retardation layer, a barrier layer; and a pressure-sensitive adhesive layer having a barrier function, wherein an angle formed between an absorption axis of the polarizer and a slow axis of the retardation layer is from 65° to 85°, and an angle formed between the absorption axis of the polarizer and a slow axis of the another retardation layer is from 10° to 20°, the polarizer is elongated and has the absorption axis in a longitudinal direction thereof; and the retardation layer and the another retardation layer are elongated, and the retardation layer has the slow axis in a direction at from 65° to 85° relative to a longitudinal direction thereof, and the another retardation layer has the slow axis in a direction at from 10° to 20° relative to a longitudinal direction thereof.

2. The circularly polarizing plate for an organic EL display apparatus according to claim 1, further comprising a protective film between the polarizer and the retardation layer.

3. The circularly polarizing plate for an organic EL display apparatus according to claim 1, further comprising a protective film between the polarizer and the another retardation layer.

4. The circularly polarizing plate for an organic EL display apparatus according to claim 1, further comprising a protective film on a side of the polarizer opposite to the retardation layer.

5. The circularly polarizing plate for an organic EL display apparatus according to claim 1, wherein:
   the polarizer is elongated and has the absorption axis in a longitudinal direction thereof; and
   the retardation layer is elongated and has the slow axis in a direction at from 35° to 55° relative to a longitudinal direction thereof.

6. The circularly polarizing plate for an organic EL display apparatus according to claim 1, wherein a ratio K/I of a potassium content (wt %) to an iodine content (wt %) in the polarizer is from 0.180 to 0.235.

7. An organic EL display apparatus, comprising the circularly polarizing plate for an organic EL display apparatus of claim 1.

* * * * *